(12) United States Patent
Larson et al.

(10) Patent No.: US 10,944,072 B2
(45) Date of Patent: Mar. 9, 2021

(54) STRETCHABLE ELECTROLUMINESCENT DEVICES

(71) Applicant: Cornell University, Ithaca, NY (US)

(72) Inventors: Chris M. Larson, Ithaca, NY (US);
Robert F. Shepherd, Ithaca, NY (US);
Bryan N. Peele, Ithaca, NY (US);
Sanlin S. Robinson, Ithaca, NY (US);
Shuo Li, Ithaca, NY (US)

(73) Assignee: Cornell University, Ithaca, NY (US)

( * ) Notice: Subject to any disclaimer, the term of this patent is extended or adjusted under 35 U.S.C. 154(b) by 182 days.

(21) Appl. No.: 15/773,052

(22) PCT Filed: Nov. 3, 2016

(86) PCT No.: PCT/US2016/060346
§ 371 (c)(1),
(2) Date: May 2, 2018

(87) PCT Pub. No.: WO2017/079445
PCT Pub. Date: May 11, 2017

(65) Prior Publication Data
US 2018/0323400 A1 Nov. 8, 2018

Related U.S. Application Data

(60) Provisional application No. 62/317,834, filed on Apr. 4, 2016, provisional application No. 62/250,172, filed on Nov. 3, 2015.

(51) Int. Cl.
*H01L 29/08* (2006.01)
*H01L 33/00* (2010.01)
(Continued)

(52) U.S. Cl.
CPC ........ *H01L 51/5253* (2013.01); *B25J 9/0012* (2013.01); *H01L 27/3211* (2013.01);
(Continued)

(58) Field of Classification Search
CPC ............. H01L 51/5253; H01L 51/0035; H01L 51/0037; H01L 51/004; H01L 51/0048;
(Continued)

(56) References Cited

U.S. PATENT DOCUMENTS 8,896,044 B1 11/2014 Byun
8,921,473 B1 12/2014 Hyman
(Continued)

FOREIGN PATENT DOCUMENTS

| WO | 2004086530 | 10/2004 |
|---|---|---|
| WO | 2014124044 | 8/2014 |
| WO | 2014/169119 A1 | 10/2014 |

OTHER PUBLICATIONS

Wang, J., et al., Highly Stretchable and Self-Deformable Alternating Current Electoluminescent Devices, Adv. Mater., Mar. 18, 2015, vol. 27, pp. 2876-2882.
(Continued)

*Primary Examiner* — Alonzo Chambliss
(74) *Attorney, Agent, or Firm* — Hodgson Russ LLP

(57) ABSTRACT

A light emitting capacitor can include a first and second electrode, an electroluminescent layer, and at least one elastomeric layer. The electroluminescent layer, which can include an elastomeric material doped with semiconducting nanoparticles, can be disposed between the first and second electrodes. The elastomeric layer can encapsulate the first electrode, second electrode, and electroluminescent layer. The first and second electrodes can be hydrogel or conductive electrodes. The light emitting capacitor can provide dynamic coloration or sensory feedback. The light emitting capacitor can be used in, for example, robotics, wearables (displays, sensors, textiles), and fashion.

40 Claims, 18 Drawing Sheets

(51) Int. Cl.

| | |
|---|---|
| *H01L 31/0232* | (2014.01) |
| *H01L 21/00* | (2006.01) |
| *H01L 51/40* | (2006.01) |
| *H01L 51/52* | (2006.01) |
| *H01L 51/50* | (2006.01) |
| *B25J 9/00* | (2006.01) |
| *H01L 27/32* | (2006.01) |
| *H01L 51/00* | (2006.01) |
| *H01L 51/56* | (2006.01) |
| *G01L 1/14* | (2006.01) |

(52) U.S. Cl.
CPC ........ *H01L 51/004* (2013.01); *H01L 51/0035* (2013.01); *H01L 51/0037* (2013.01); *H01L 51/0048* (2013.01); *H01L 51/502* (2013.01); *H01L 51/5012* (2013.01); *H01L 51/5032* (2013.01); *H01L 51/5206* (2013.01); *H01L 51/5234* (2013.01); *H01L 51/56* (2013.01); *G01L 1/148* (2013.01); *H01L 51/0094* (2013.01); *H01L 51/0097* (2013.01); *H01L 51/52* (2013.01); *H01L 2251/301* (2013.01); *H01L 2251/303* (2013.01); *H01L 2251/5338* (2013.01); *H01L 2251/564* (2013.01)

(58) Field of Classification Search
CPC ............... H01L 51/502; H01L 51/5032; H01L 51/5206; H01L 51/56; H01L 27/3211; H01L 51/5012
See application file for complete search history.

(56) References Cited

U.S. PATENT DOCUMENTS

| | | | |
|---|---|---|---|
| 2004/0018382 A1 | 1/2004 | Kinlen | |
| 2009/0072728 A1* | 3/2009 | Moran-Mirabal | B82Y 20/00 313/504 |
| 2009/0212690 A1 | 8/2009 | Bruton et al. | |
| 2010/0270924 A1 | 10/2010 | Kaminska et al. | |
| 2011/0001153 A1 | 1/2011 | Tchakarov et al. | |
| 2013/0251943 A1 | 9/2013 | Pei et al. | |
| 2014/0027756 A1* | 1/2014 | Nakamura | H01L 51/5228 257/40 |
| 2015/0129276 A1 | 5/2015 | Shumaker et al. | |
| 2015/0171362 A1 | 6/2015 | Sato et al. | |
| 2015/0188078 A1 | 7/2015 | Osawa et al. | |
| 2015/0311474 A1 | 10/2015 | Basil et al. | |
| 2015/0357078 A1 | 12/2015 | Lessing et al. | |
| 2016/0057835 A1 | 2/2016 | Wang et al. | |
| 2016/0165719 A1 | 6/2016 | Li et al. | |
| 2016/0233447 A1 | 8/2016 | Kim et al. | |

OTHER PUBLICATIONS

Lee, P., et al., Highly Stretchable and Highly Conductive Metal Electrode by Very Long Metal Nanowire Percolation Network, Adv. Mater., 2012, vol. 24, No. 25, pp. 3326-3332.

Hao, G., et al., Stretchable and Semitransparent Conductive Hybrid Hydrogels for Flexible Supercapacitors, ACN Nano, 2014, vo.. 8, No. 7, pp. 7138-7146.

Bai, Y., et al., Transparent hydrogel with enhanced water retention capacity by introducing highly hydratable salt, Applied Physics Letters, 2015, vol. 105, No. 15, 151903, 6 pages.

Dow Corning, Sylgard 184 Silicone Elastomer Product Information, Apr. 2, 2014, p. 2, Typical Properties Table, pp. 1-4.

Barbosa, A., et al., Cuttlefish use visual cues to determine arm postures for camouflage, P.R. Soc. B-Biol. Sci., May 11, 2011, vol. 279, No. 1726, pp. 84-90.

Messenger, J.B., Cephalopod chromatophores: neurobiology and natural history, Biol. Rev. Camb. Philos. Soc., Nov. 2001, vol. 76, No. 4, pp. 473-528.

Mathger, M.L., et al., Mechanisms and behavioural functions of structural coloration in cephalopods., J. R. Soc. Interface, Dec. 15, 2008, vol. 6, No. Suppl. 2, pp. S149-S163.

Arnold, J.M., et al., Ultrastructure of a cephalopod photophore. I. structure of the photogenic tissue, The Biol. Bull., Dec. 1974, vol. 147, No. 3, pp. 507-521.

Allen, J.J., et al., Comparative morphology of changeable skin papillae in octopus and cuttlefish, J. Morphol., Dec. 3, 2013, vol. 275, No. 4, pp. 371-390.

Deravi, L.F., et al., The structure-function relationships of a natural nanoscale photonic device in cuttlefish chromatophores, J. R. Soc. Interface, Apr. 6, 2014, vol. 11, No. 93, pp. 20130942.

Ilievski, F., et al., Soft robotics for chemists, Angew. Chem. Int. Ed., Jan. 20, 2011, vol. 50, No. 8, pp. 1890-1895.

Trimmer, B., Soft robots. Curr. Biol., Aug. 5, 2013, vol. 23, No. 15, pp. R639-R641.

Spenko, M.J., et al., Biologically inspired climbing with a hexapedal robot, J. Field Robot., Apr. 10, 2008, vol. 25, No. 4-5, pp. 223-242.

Rogers, J.A., et al., Materials and mechanics for stretchable electronics, Science, Mar. 26, 2010, vol. 327, No. 5973, pp. 1603-1607.

Morin, S.A., et al., Camouflage and display for soft machine, Science, Aug. 17, 2012, vol. 337, No. 6096, pp. 828-832.

Wang, Q.,et al., Cephalopod-inspired design of electro-mechano-chemically responsive elastomers for on-demand fluorescent patterning, Nat. Commun., Sep. 16, 2014, vol. 5, No. 4899.

Burrows, P.E., et al., Ultra barrier flexible substrates for flat panel displays, Displays, May 24, 2001, vol. 22, No. 2, pp. 65-69.

Han, T.H., et al., Extremely efficient flexible organic light-emitting diodes with modified graphene anode, Nat. Photonics, Jan. 10, 2012, vol. 6, No. 2, pp. 105-110.

Sekitani, T., et al., Stretchable active-matrix organic light-emitting diode display using printable elastic conductors, Nat. Mater., May 10, 2009, vol. 8, No. 6, pp. 494-499.

Shin, M.K., et al., Elastomeric conductive composites based on carbon nanotube forests, Adv. Mater., Jun. 28, 2010, vol. 22, No. 24, pp. 2663-2667.

White, M., et al., Ultrathin, highly flexible and stretchable PLEDs, Nat. Photonics., Jul. 28, 2013,, vol. 7, No. 10, pp. 811-816.

Hu, L., et al., Scalable coating and properties of transparent, flexible, silver nanowire electrodes, ACS Nano, May 25, 2010, vol. 4, No. 5, pp. 2955-2963.

Liang, J., et al., Elastomeric polymer light-emitting devices and displays, Nat. Photonics, Sep. 22, 2013, vol. 7, pp. 817-824.

Someya, T., et al., Conformable, flexible, large-area networks of pressure and thermal sensors with organic transistor active matrixes, Proc. Natl. Acad. Sci. U.S.A., Aug. 30, 2005, vol. 102, No. 35, pp. 12321-12325.

Takei, K., et al., Nanowire active-matrix circuitry for low-voltage macroscale artificial skin, Nat. Mater., Sep. 12, 2010, vol. 9, No. 10, pp. 821-826.

Someya, T., et al., A large-area, flexible pressure sensor matrix with organic field-effect transistors for artificial skin applications, Proc. Natl. Acad. Sci. U.S.A., Jul. 6, 2004, vol. 101, No. 7, pp. 9966-9970.

Park, Y., et al., Design and fabrication of soft artificial skin using embedded microchannels and liquid conductors, IEEE Sens. J., Aug. 2012, vol. 12, No. 8, pp. 2711-2718.

Cotton, D.P.J., et al., A multifunctional capacitive sensor for stretchable electronic skins, IEEE Sens. J., Dec. 2009, vol. 9, No. 12, pp. 2008-2009.

Keplinger, C., et al., Stretchable, transparent, ionic conductors, Science, Aug. 30, 2013, vol. 341, No. 6149, pp. 984-987.

Sun, J.Y., et al., Highly stretchable and tough hydrogels, Nature, Sep. 6, 2012, vol. 489, No. 7414, pp. 133-136.

Sun, J.Y., et al., Ionic skin, Adv. Mater., Dec. 3, 2014, vol. 26, No. 45, pp. 7608-7614.

Xia, Y., et al., Soft lithography, Angew. Chem. Int. Ed., Mar. 16, 1998, vol. 37, No. 5, pp. 550-575.

Hanlon, R.T., et al., Adaptive coloration in young cuttlefish (*Sepia officinalis* L.): the morphology and development of body patterns and their relation to behavior, Phil. Trans. R. Soc. Land. B, Aug. 12, 1988, vol. 320, No. 1200, pp. 437-487.

(56) References Cited

OTHER PUBLICATIONS

Akkaynak, D., et al., Quantification of cuttlefish (*Sepia officinalis*) camouflage: a study of color and luminance using in situ spectrometry, J. Comp. Physiol. A, Mar. 2013, vol. 199, No. 3, pp. 211-225.

Barbosa, A. et al., Cuttlefish camouflage: the effects of substrate contrast and size in evoking uniform, mottle or disruptive body patterns, Vision Res., May 2008, vol. 48, No. 10, pp. 1242-1253.

Zylinski, S., et al., Mesopelagic cephalopods switch between transparency and pigmentation to optimize camouflage in the deep, Curr. Biol., Nov. 22, 2011, vol. 21, No. 22, pp. 1937-1941.

Shepherd, R.F., et al., Soft machines that are resistant to puncture and that self seal, Adv. Mater., Dec. 10, 2013, vol. 25, No. 46, pp. 6709-6713.

Hou, J., et al., Design of a biomimetic skin for an octopus-inspired robot—part I: characterising octopus skin, J. Bionic Eng., Sep. 1, 2011, vol. 8, No. 3, pp. 288-296.

Hou, J., et al., Developing skin analogues for a robotic octopus, J. Bionic Eng., Sep. 1, 2012, vol. 9, No. 3, pp. 385-390.

Shepherd, R.F., et al., Multigait soft robot, Proc. Natl. Acad. Sci. U.S.A., Dec. 20, 2011, vol. 108, No. 51, pp. 20400-20403.

Zhang, L., et al., Mechanical constraints enhance electrical energy densities of soft dielectrics, App. Phys. Lett., Oct. 25, 2011, vol. 99, No. 17, 171906.

Buresch, K.C., et al., Cuttlefish adjust body pattern intensity with respect to substrate intensity to aid camouflage, but do not camouflage in extremely low light, J. Exp. Mar. Biol. Ecol., Jan. 1, 2015, vol. 462, pp. 121-126.

Alfrey, G.F., et al., Electroluminescence in single crystals of zinc sulphide, Proc. Phys. Soc. B, Oct. 1955, vol. 68, No. 10, pp. 775.

Yu, C., et al., Adaptive optoelectronic camouflage systems with designs inspired by cephalopod skins, Proc. Natl. Acad. Sci. U.S.A., Sep. 9, 2014, vol. 111, No. 36, pp. 12998-13003.

Tolley, M.T., et al., A resilient, untethered soft robot, Soft Robotics, Sep. 17, 2014, vol. 1, No. 3, pp. 213-223.

\* cited by examiner

A Unstretched  B Stretched

A  Rest State     B  Actuated States

STRETCHABLE ELECTROLUMINESCENT DEVICES

CROSS-REFERENCE TO RELATED APPLICATIONS

This application claims priority to the provisional patent application filed Nov. 3, 2015 and assigned U.S. App. No. 62/250,172 and to the provisional patent application filed Apr. 4, 2016 and assigned U.S. App. No. 62/317,834, the disclosures of which are hereby incorporated by reference.

STATEMENT REGARDING FEDERALLY-SPONSORED RESEARCH OR DEVELOPMENT

This invention was made with government support under Grant Number DMR-1120296 awarded by the National Science Foundation; under Grant Number DGE-1144153 awarded by the National Science Foundation; under Grant Number W911NF-15-1-0464 from the Army Research Office; under Grant Number FA9550-15-1-0160 from the Air Force Office of Scientific Research; and under Grant Number ECCS-1542081 awarded by the National Science Foundation. The government has certain rights in the invention.

FIELD OF THE DISCLOSURE

This disclosure relates to light-emitting capacitors.

BACKGROUND OF THE DISCLOSURE

Vertebrates and invertebrates alike employ a host of strategies for visualization and camouflage. Some examples include changing their skin color or texture, as well as mimicry via posturing. Cephalopods (e.g. squid, octopus, and cuttlefish) modulate their skin color and tone using subcutaneous neuromuscular organs called leucophores, iridiphores, and chromatophores present in the thousands. Chromatophores, elastic sacs that each contain pigment of a specific color, are controlled by a complex array of nerves and muscles. When excited, surrounding muscles contract and cause the sac to expand, making the color more visible. When the muscle relaxes, energy stored in the elastic sacculus causes it to retract. Through control of these different coloration organs, cephalopods emit, absorb, and reflect light for dynamic coloration.

Recent advances in stretchable, transparent electrode technology have enabled visual displays that are highly compliant, flexible, and stretchable to greater than twice their nominal length. These synthetic material systems, however, are no match for displays found in nature, such as cephalopod skin, which can expand its surface area by up to 500%. This high extensibility, in combination with organs devoted to light emission and absorption, allow cephalopods such as octopuses to control both posture and color for visual communication and disguise.

Among cephalopods, the octopus is very good at camouflage, being able to change not only its coloration but also skin texture to match a wide range of visual environments. Octopuses modulate their texture by controlling the size of the projections (or papillae) on their skin, allowing surfaces ranging from smooth to bumps and spikes. The large dynamic range of texture is possible due to the high extensibility of their tissue, which also allows extreme shape changes that they use for posturing and mimicry. Similarly, the cuttlefish uses extreme skin stretching when expanding chromatophores for color change, locally increasing its surface area by up to 500%. This skin extensibility and chromatophore control allow cephalopods to survive in their natural environments; similarly, the development of synthetic material systems that are fully soft with functionality approximating that of cephalopods will be broadly enabling in the fields of robotics, biomimicry, and wearable devices such as displays, sensors, and textiles.

Recent developments in soft robotics, bioinspired design, and materials science reveal strategies that might enable engineering of some of the functions of cephalopod skin synthetically. For example, microfluidic networks filled with liquid dyes have been used as active camouflage and displays for soft mobile robots, giving them the ability to change their appearance via color, texture, and luminescence. More recently, electro-mechano-chemically responsive (EMCR) films were exploited to render fluorescent patterns under the control of electric fields, mimicking the visual appearance of cephalopod skin. Another potential approach is the use of active display technologies, such as PLEDs or OLEDs that use stretchable, transparent electrodes based on indium tin oxide films (ITO), graphene, single or multi-walled carbon nanotubes (SWNTs, MWNTs), polyethylene-dioxythiophene: polystyrene-sulfonate (PEDOT:PSS), or other percolated networks of conductive colloids or nanowires (e.g., Ag). Despite the broad applicability of LED-based systems for consumer displays, their electrical function is limited to ultimate strains ($\Lambda$ult) less than 120%, which are well below the ultimate strain of elastomeric substrates (e.g., silicones; $\Lambda$ult ~400-700%) that are used in soft robotics to mimic the movements of animals.

Biological skins also enable animals to feel their environments as well as themselves (i.e., exteroception and proprioception). A number of approaches have been used to create pressure sensitive electronic skins, including arrays of organic field-effect transistors (FETs) deposited on flexible parylene-polyamide substrates and inside stretchable rubber, as well as thin Au films and liquid-metal embedded in polydimethylsiloxane (PDMS). More recently, dielectric elastomer transducers (DETs), stretchable capacitors composed of highly extensible ionic hydrogels, have been used for this purpose. These hydrogels are intrinsically soft, highly transparent in the visible spectrum (extinction coefficient, $\mu$ext ~10-6 $\mu m^{-1}$), can exhibit very high ultimate strain ($\Lambda$ult ~2,000%) and toughness (U ~9 kJ $m^{-2}$), and have relative changes in resistivity with strain that are orders of magnitude less than electrodes based on percolated networks of conductive particles (e.g., metal nanoparticles, carbon powder, nanotubes).

Therefore, what is needed is an improved light-emitting capacitor, materials and devices that include an improved light-emitting capacitor, and methods of making an improved light-emitting capacitor.

BRIEF SUMMARY OF THE DISCLOSURE

Statement 1. A light-emitting capacitor comprises a first electrode; a second electrode; an electroluminescent layer comprising an elastomeric material doped with semiconducting nanoparticles; and at least one elastomeric material layer that encapsulates the first electrode, the second electrode, and the electroluminescent layer. The electroluminescent layer is disposed between the first electrode and the second electrode.

Statement 2. The light-emitting capacitor of Statement 1, wherein the elastomeric material of the electroluminescent layer includes a transparent or translucent silicone, polyurethane, fluoroelastomer, or a combination thereof.

Statement 3. The light-emitting capacitor of Statement 1 or 2, wherein the elastomeric material of the elastomeric material layer includes silicone.

Statement 4. The light-emitting capacitor of any one of Statements 1-3, wherein the elastomeric material layer has an elastic modulus from 1 kPa to 10 MPa.

Statement 5. The light-emitting capacitor of any one of Statements 1-4, wherein the semiconducting nanoparticles are ZnS nanoparticles, ZnSe nanoparticles, CdSe nanoparticles, CdS nanoparticles, ZnO nanoparticles, CdO nanoparticles, $Cu_2s$ nanoparticles, $CuInSe_2$ nanoparticles, CdZnO nanoparticles, CdTe nanoparticles, or a combination thereof.

Statement 6. The light-emitting capacitor of any one of Statements 1-5, wherein the semiconducting nanoparticles comprise a dopant.

Statement 7. The light-emitting capacitor of Statement 6, wherein the dopant is selected from copper ions, manganese ions, zinc ions, indium ions, chloride ions, aluminum ions, or a combination thereof.

Statement 8. The light-emitting capacitor of Statement 6 or 7, wherein the dopant is present at from 0.1 to 5% by mass.

Statement 9. The light-emitting capacitor of any one of Statements 1-8, wherein the light-emitting capacitor is configured to reversibly stretch uniaxially to at least 300% strain while emitting light having a wavelength from 400 nm to 700 nm.

Statement 10. The light-emitting capacitor of any one of Statements 1-9, wherein the light-emitting capacitor is configured to reversibly stretch uniaxially to at least 500% strain while emitting light having a wavelength from 400 nm to 700 nm.

Statement 11. The light-emitting capacitor of any one of Statements 1-10, wherein the light-emitting capacitor is configured to reversibly expand its surface area by at least 300% while emitting light having a wavelength from 400 nm to 700 nm.

Statement 12. The light-emitting capacitor of any one of Statements 1-11, wherein the light-emitting capacitor is configured to reversibly expand its surface area by at least 500% while emitting light having a wavelength from 400 nm to 700 nm.

Statement 13. The light-emitting capacitor of any one of Statements 1-12, wherein at least two of the elastomeric material layers encapsulate the first electrode, the second electrode, and the electroluminescent layer.

Statement 14. The light-emitting capacitor of any one of Statements 1-13, wherein the first electrode is a first hydrogel electrode and the second electrode is a second hydrogel electrode.

Statement 15. The light-emitting capacitor of Statement 14, wherein the first hydrogel electrode and the second hydrogel electrode include polyacrylamide, poly(hydroxyethyl methacrylate), poly(ethylene glycol) diacrylate, a triacrylate, or a combination thereof and/or an aqueous salt.

Statement 16. The light-emitting capacitor of Statement 15, wherein the first hydrogel electrode and the second hydrogel electrode include the aqueous salt, and wherein the aqueous salt includes lithium chloride.

Statement 17. The light-emitting capacitor of Statement 15 or 16, wherein the first hydrogel electrode and the second hydrogel electrode include the aqueous salt, and wherein the aqueous salt is present at from 0.1 to 50% by volume.

Statement 18. The light-emitting capacitor of any one of Statements 1-13, wherein the first electrode is a first conductive electrode and the second electrode is a second conductive electrode.

Statement 19. The light-emitting capacitor of Statement 18, wherein one or both of the first and second conductive electrodes comprise a film of carbon black, single-walled carbon nanotubes (SWCNTs), multi-walled carbon nanotubes (MWCNTs), poly(3,4-ethylenedioxythiophene) polystyrene sulfonate (PEDOT:PSS), or polyaniline.

Statement 20. The light-emitting capacitor of Statement 18 or 19, wherein the elastomeric material layer includes silicone having an elastic modulus of 1 kPa to 10 MPa.

Statement 21. The light-emitting capacitor of any one of Statements 18-20, wherein a total thickness of the light-emitting capacitor is from 10 microns to 1 cm.

Statement 22. The light-emitting capacitor of any one of Statements 18-21, wherein the semiconducting nanoparticles comprises a dopant.

Statement 23. The light-emitting capacitor of Statement 22, wherein the semiconductor nanoparticles are ZnS and the dopant is Cu, wherein the semiconductor nanoparticles are ZnS and the dopants are Cu and Cl, wherein the semiconductor nanoparticles are ZnS and the dopants are Cu and Al, and/or wherein the semiconductor nanoparticles are ZnS and the dopants are Cu, Mn, and Al.

Statement 24. The light-emitting capacitor of any one of Statements 18-23, wherein the light-emitting capacitor is configured to stretch uniaxially to at least 150% strain while emitting light having a wavelength from 400 nm to 700 nm.

Statement 25. A material comprising a plurality of the light-emitting capacitors of any one of Statements 1-24 disposed in the at least one elastomeric material layer.

Statement 26. The material of Statement 25, wherein two of the elastomeric material layers encapsulate the plurality of light emitting capacitors.

Statement 27. The material of Statement 25 or 26, wherein the plurality of light emitting capacitors include a ZnS-based material ranging in size from 10 nm to 10 micron diameters.

Statement 28. The material of any one of Statements 25-27, wherein the plurality of light emitting capacitors comprise ZnS nanoparticles doped with Cu that range in size from 10 nm to 10 micron diameters.

Statement 29. The material of any one of Statements 25-28, wherein the material and/or light emitting capacitors is/are configured to provide sensory feedback.

Statement 30. The material of any one of Statements 25-29, wherein the material is disposed on at least a portion of a robot, a fluidically actuated device, or a human-touch device.

Statement 31. The material of any one of Statements 25-30, wherein the material is disposed on at least a portion of a display.

Statement 32. The material of any one of Statements 25-31, wherein the material is disposed on at least a portion of an elastomeric foam material.

Statement 33. A device comprising one or more of the light-emitting capacitors of any one of Statements 1-24.

Statement 34. The device of Statement 33, wherein the device is a robot, a display, or a human touch interface and wherein the one or more of the light-emitting capacitors is/are disposed on a portion of or all of an exterior surface of the device.

Statement 35. The device of Statement 33 or 34, wherein the one or more of the light-emitting capacitors is/are configured to provide dynamic coloration, exteroception, and/or proprioception in the device.

Statement 36. The device of any one of Statements 33-35, wherein the device further comprises a pneumatic or hydraulic actuator that comprises an inextensible layer encased in a second elastomeric material and a second elastomeric material layer including at least one independently-controlled chamber.

Statement 37. The device of Statement 36, wherein the inextensible layer includes an inextensible woven or unwoven fiber mesh and the second elastomeric material encasing the inextensible layer includes silicone, fluoropolymer, or polyurethane.

Statement 38. The device of Statement 36, wherein the inextensible layer includes a nylon.

Statement 39. The device of any one of Statements 36-38, wherein the second elastomeric material layer includes silicone, fluoroelastomer, or polyurethane.

Statement 40. A fabrication method of the device of any one of Statements 33-39, wherein the fabrication includes using one or more of replica molding, spray patterning, inkjet printing, spin-coating, tape casting, or screen-printing.

Statement 41. The fabrication method of Statement 40, wherein the fabrication includes using one or more of spray patterning, inkjet printing, spin-coating, tape casting, or screen-printing, and wherein the sprayable silicone precursor comprises a polymer mixture and an organic solvent.

Statement 42. The fabrication method of Statement 41, wherein the organic solvent is one or more of toluene, dimethylformaldehyde, or hexane.

Statement 43. The fabrication method of Statement 40, wherein the fabrication includes one or more of spray patterning, inkjet printing, spin-coating, tape casting, or screen-printing, wherein a sprayable electrode precursor comprises a dispersion with a solvent.

Statement 44. The fabrication method of Statement 43, wherein the solvent is at least one of an aqueous solvent for PEDOT:PSS, polyaniline, and COOH-functionalized multi- and single-walled carbon nanotubes or the solvent is an organic-based solvent.

Statement 45. The fabrication method of Statement 44, wherein the organic-based solvent is one or more of toluene or dimethyl sulfoxide for non-functionalized multi- and single-walled carbon nanotubes.

DESCRIPTION OF THE DRAWINGS

For a fuller understanding of the nature and objects of the disclosure, reference should be made to the following detailed description taken in conjunction with the accompanying drawings.

FIG. 7A(a) is a top view of the pneumatic actuator design. FIG. 7A(b) is a cross-section view thereof, taken along line A-A of FIG. 7A(a). FIG. 7A(c) is a detail view thereof, depicting area C of FIG. 7A(b). FIG. 7B(a) is a side view of the pneumatic actuator design. FIG. 7B(b) is a cross-section view thereof, taken along line B-B of FIG. 7B(a). FIG. 7C is an exploded view of the pneumatic actuator design.

DETAILED DESCRIPTION OF THE DISCLOSURE

Figure 1:
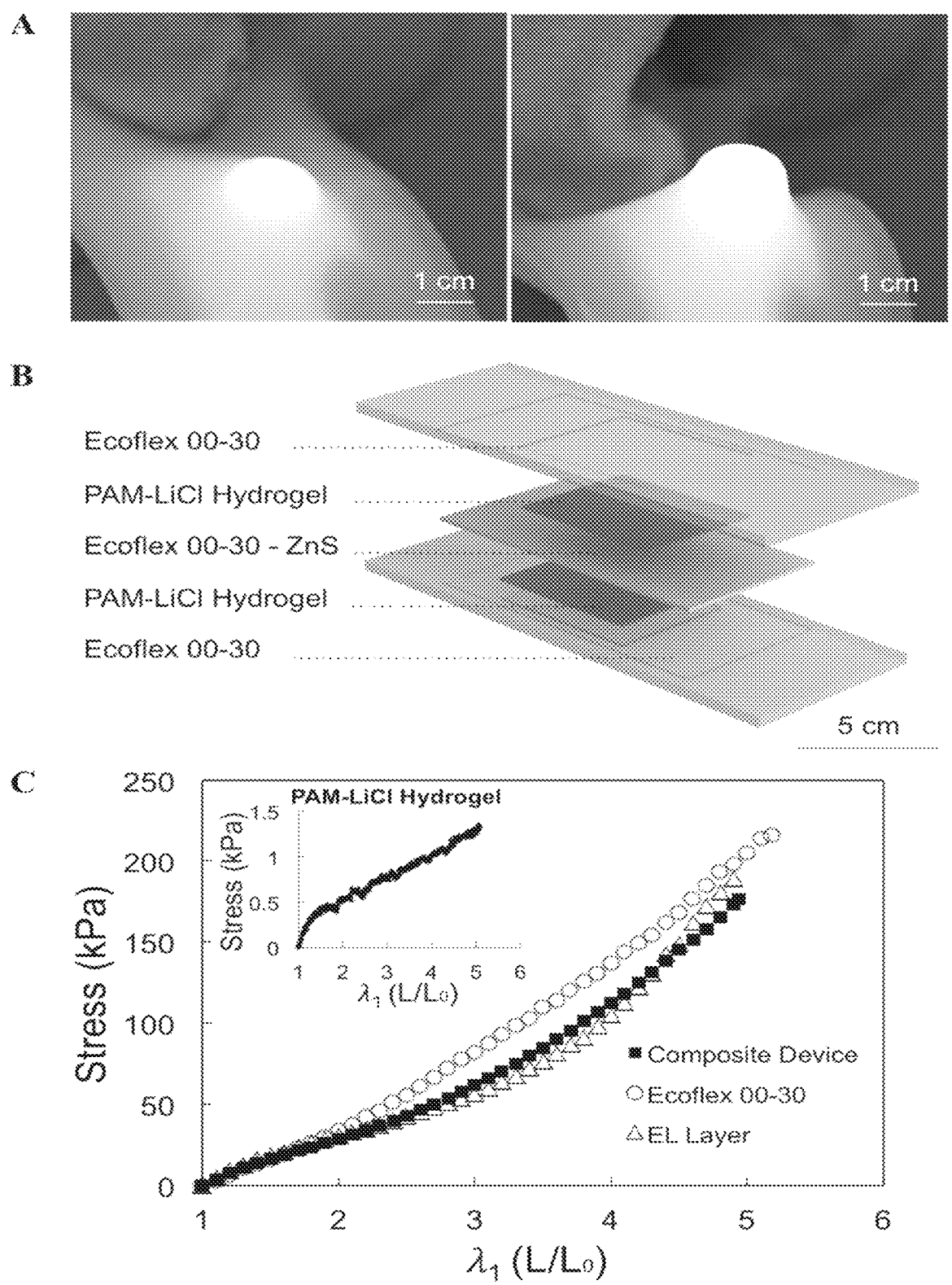
FIG. 1. An embodiment of a light-emitting capacitor. (A) Stretchable electroluminescent skin conforming to the end of a mechanical pencil, (B) exploded view of the hyperelastic light emitting capacitor (HLEC) showing its five-layer structure consisting of a ~1 mm thick dielectric electroluminescent layer that is sandwiched between two hydrogel electrodes and encapsulated in Ecoflex 00-30, and (C) stress-stretch curves of Ecoflex 00-30, the ZnS-Ecoflex electroluminescent layer, the hydrogel electrode, and the assembled structure.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The present disclosure provides light-emitting capacitors. Also provided are methods of making and using the light-emitting capacitors. The present disclosure provides, for example, a hyperelastic light emitting capacitor (HLEC) capable of emitting light at uniaxial strains of at least 300% or strains of nearly 500% while also functioning as a tactile sensor. Light-emitting capacitors can be incorporated into a material (e.g., a synthetic light emitting skin) that can be incorporated into, for example, soft robots to impart, for example, dynamic coloration, exteroception, and proprioception as a step towards mimicking the capabilities of cephalopods.

In an aspect, the present disclosure provides light-emitting capacitors. For example, a light-emitting capacitor is a hyperelastic light emitting capacitor, or HLEC. A light-emitting capacitor can comprise one or more conductive or hydrogel electrodes (e.g., first and second hydrogel electrodes or first and second conductive electrodes), an electroluminescent layer comprising elastomeric material (e.g., a silicone, polyurethane, fluoroelastomer, or a combination thereof), which may be a transparent or translucent elastomeric material, doped with semiconducting nanoparticles, where the electroluminescent layer is disposed between two electrodes, and at least one elastomeric material layer that encapsulates the electrodes and the electroluminescent layer. The two electrodes can be, for example, first and second hydrogel electrodes or first and second conductive electrodes. The elastomeric material layer can include, for example, a transparent or translucent silicone, polyurethane, fluoroelastomer, or a combination thereof. Two elastomeric material layers can encapsulate the two electrodes and the electroluminescent layer.

In an example, the HLEC that is capable of stretching uniaxially to nearly 500% strain, and expanding its surface area by ~635%, while displaying a range of visible colors. A hyperelastic light emitting capacitor skin can be overlaid onto a soft robot for dynamic posture control. In addition to dynamic coloration, a hyperelastic light emitting capacitor skin can provide sensory feedback that enables exteroception and proprioception in the soft robot.

The elastomeric material layer, which can include silicone or other materials, can exhibit a range of elastic modulus values. For example, an elastomeric material layer can have an elastic modulus of 1 kPa to 10 MPa, including all 0.1 kPa values and ranges therebetween. Suitable elastomeric materials are commercially available and can be made by methods known in the art.

Any semiconducting nanoparticles can be used. Suitable semiconducting nanoparticles are commercially available and can be made by methods known in the art. Examples of semiconducting nanoparticles include, but are not limited to, ZnS nanoparticles, ZnSe nanoparticles, CdSe nanoparticles, CdS nanoparticles, ZnO nanoparticles, CdO nanoparticles, $Cu_2S$ nanoparticles, $CuInSe_2$ nanoparticles, CdZnO nanoparticles, CdTe nanoparticles, and combinations thereof.

Semiconducting nanoparticles can comprise a dopant, such as a metal ion dopant. Examples of dopants include, but are not limited to, copper ions, manganese ions, zinc ions, indium ions, halogen ions (e.g., chloride ions), and combinations thereof. The dopant can be present in the nanoparticles at 0% to 5% by mass, including all 0.1% by mass values and ranges therebetween. For example, dopant(s) is/are present in the nanoparticles at 0.1% to 5% by mass. Examples of doped nanoparticles include ZnS nanoparticles doped with copper ions; copper ions and chloride ions; copper ions and aluminum ions; or copper ions, manganese ions, and aluminum ions. For example, one or more of the plurality of light emitting capacitors comprise ZnS nanoparticles doped with Cu that range in size from 10 nm to 10 micron diameters. The semiconducting nanoparticles can be doped using methods known in the art.

In an aspect, quantum dots can be included as a light-emitting particle.

A hydrogel electrode can comprise one or more polymeric materials that can form a hydrogel. The polymeric material(s) can be cross-linked. Suitable polymeric materials (e.g., polymers) are commercially available and can be made by methods known in the art. Examples of polymeric materials included, but are not limited to, polyacrylamide, poly(hydroxyethyl methacrylate), poly(ethylene glycol) diacrylate, triacrylates, and combinations thereof, which may be cross-linked by methods known in the art. One or more of the hydrogel electrodes (e.g., the first hydrogel electrode and/or second hydrogel electrode) can comprise an aqueous salt. The aqueous salt may be, for example, one or more alkali metal salts such as, for example, a lithium salt (e.g., lithium chloride), sodium salt (e.g., sodium chloride), potassium salt (e.g., potassium chloride), or combinations thereof. For example, one or more of the hydrogel electrodes comprise aqueous salt (e.g., lithium chloride) at, for example, 0.1 to 50% by volume, including all 0.1% by volume values and ranges therebetween. For example, one or more of the hydrogel electrodes (e.g., the first hydrogel electrode and/or second hydrogel electrode) comprise aqueous lithium chloride at, for example, 0 to 50% by volume, including all 0.1% by volume values and ranges therebetween.

A conductive electrode can comprise a film of carbon black, single-walled carbon nanotubes (SWCNTs), multi-walled carbon nanotubes (MWCNTs), poly(3,4-ethylenedioxythiophene) polystyrene sulfonate (PEDOT:PSS), or polyaniline. The elastomeric layer can include a silicone having an elastic modulus of 1 kPa to 10 MPa. A total thickness of the light-emitting capacitor can be from 10 μm to 1 cm, including all ranges and values to the 1 μm therebetween. Semiconducting nanoparticles can be included in the electroluminescent layer. The semiconducting nanoparticles can comprise a dopant. For example, the semiconductor nanoparticles are ZnS and the dopant is Cu; the semiconductor nanoparticles are ZnS and the dopants are Cu and Cl; the semiconductor nanoparticles are ZnS and the dopants are Cu and Al; and/or the semiconductor nanoparticles are ZnS and the dopants are Cu, Mn, and Al. The light-emitting capacitor is configured to stretch uniaxially to at least 150% strain while emitting light having a wavelength from 400 nm to 700 nm.

A light-emitting capacitor can exhibit desirable properties. For example, a light-emitting capacitor can stretch (e.g., reversibly) uniaxially, such as to at least 300%, at least 400%, at least 450%, or at least 500% strain, while emitting light having a wavelength of, for example, 400 nm to 700 nm, including all integer nm values and ranges therebetween. In various examples, the light-emitting capacitor can expand its surface area by, for example, at least 500%, at least 600% (e.g., at least 635%), at least 700%, at least 800%, at least 900%, at least 1000% or at least 2000%, while emitting light having a wavelength of, for example, 400 nm to 700 nm, including all integer nm values and ranges therebetween.

In an aspect, the present disclosure provides a material comprising one or more light-emitting capacitors. The material can comprise a plurality of light emitting capacitors disposed in an elastomeric material layer, such as a layer of silicone, polyurethane, fluoroelastomer, or other elastomeric material. The elastomeric material can be transparent or translucent. For example, the elastomeric material layer comprises silicone. Suitable elastomeric materials are commercially available and can be made by methods known in the art. For example, two or more elastomeric material layers, such as silicone layers, can encapsulate a plurality of light emitting capacitors. The material and/or light emitting capacitors can be configured to provide sensory feedback.

The light-emitting capacitors can be disposed on at least a portion or all of an exterior surface of device, such as a robot, a display, or a human touch interface. The robot can be a fluidically-actuated robot or fluidically-actuated display. For example, the material is disposed on at least a portion of an elastomeric foam material. The device also can be a fluidically-actuated device. The device or one or more of the light-emitting capacitors can be configured to provide dynamic coloration, exteroception, and/or proprioception of the device.

The device can further comprise one or more pneumatic and/or hydraulic actuators. A pneumatic and/or hydraulic actuator can comprise an inextensible layer including an inextensible woven or unwoven fiber mesh (e.g., a nylon sheet) encased in an elastomeric material, (e.g., silicone, polyurethane, fluoroelastomer, or other elastomeric material) and an elastomeric material layer comprising an elastomeric material (e.g., silicone, fluoroelastomer, polyurethane, or other elastomeric material) and at least one independently-controlled chamber. The elastomeric material can be transparent or translucent.

In an aspect, thin-film electrodes comprised of carbon nanotubes or conductive polymers can be used.

Figure 21:
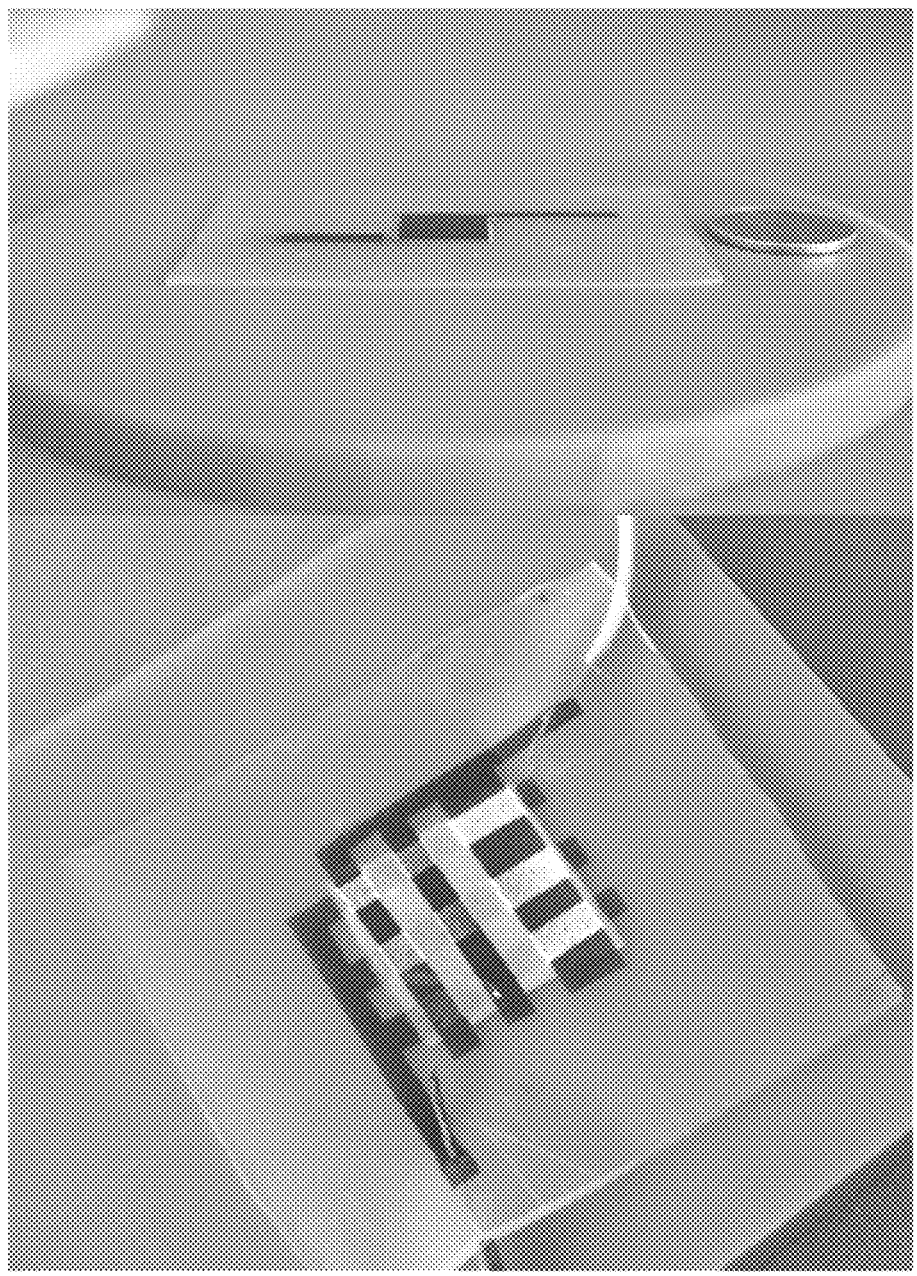
FIG. 21. Stretchable electroluminescent device comprised of a ~1 mm cast silicone substrate on which i) a first electrode comprised of multi-walled carbon nanotubes, ii) a first dielectric layer comprised of silicone, iii) an emissive layer comprised of a silicone-doped ZnS elastomeric composite, iv) a second dielectric layer comprised of silicone, v) a second electrode comprised of multi-walled carbon nanotubes, and vi) an encapsulating layer comprised of silicone are sprayed sequentially through masks and cured. The total thickness of the sprayed layers in this device measures ~200 microns.

Fabrication techniques that enable the fabrication of thinner devices with lower power requirements can be performed. This includes spray deposition, inkjet printing, spin coating, screen printing, and tape casting. For example, see FIG. 21.

Patterning the electroluminescent and/or electrodes can be performed using photolithography, stereolithography, projection-based lithography, automated extrusion printing, or a combination thereof.

In an aspect, a multicolor electroluminescent layer for stretchable display and sensory feedback can be fabricated using ZnS phosphor-doped photopolymer to form red, green, and blue pixels by UV exposure curing. These are then picked up by acrylic stamp supported thermal release tapes and transfer printed onto a single elastomer substrate.

Example 1

An extremely stretchable light emitting display enabled by electroluminescent (EL) phosphors embedded in stretchable capacitors is disclosed (FIG. 1A). This hyperelastic light emitting capacitor (HLEC) was fabricated using replica molding and assembly of ionic hydrogels electrodes and composites of EL particles embedded in a dielectric matrix of silicone elastomer. The display emits light up to engineering strains (as measured in uniaxial tension) of 485%, exceeding the highest reported values for PLEDs (120%). In addition to its luminescence, by exploiting the same inner parallel plate capacitor and its change in electrical properties during deformation, the HLEC serves as a tactile interface. Like cephalopods that use both color and posture for dramatic performances of both disguise and display, the HLEC is integrated seamlessly into a crawling soft robot, as a synthetic skin, and demonstrated its ability to undergo large deformations and shape changes while remaining luminescent. Equipped with a single layer of electroluminescent skin, soft robots are able to change their brightness and color electrically, sense external mechanical stimuli (i.e., exteroception), and feel their own deformation in space (i.e., proprioception).

The display technology was selected by the need for reversible deformation at high strains and for fabrication that is compatible with elastomeric robots (i.e., replica molding). While LEDs offer clear performance benefits for high-resolution displays, their limited strain capability (~120%) has precluded their use in extreme strain regimes such as those encountered in soft robotics and as experienced by cephalopods. To overcome this limitation, electroluminescent phosphors that emit light via excitations within semiconducting ZnS particles under an AC electric field were used. This process takes place at intrinsic heterojunctions within the EL powders (as opposed to physical p-n junctions formed via lithography), making the HLEC display a low cost alternative that is compatible with a variety of facile fabrication methods based on casting and molding.

Figure 5:
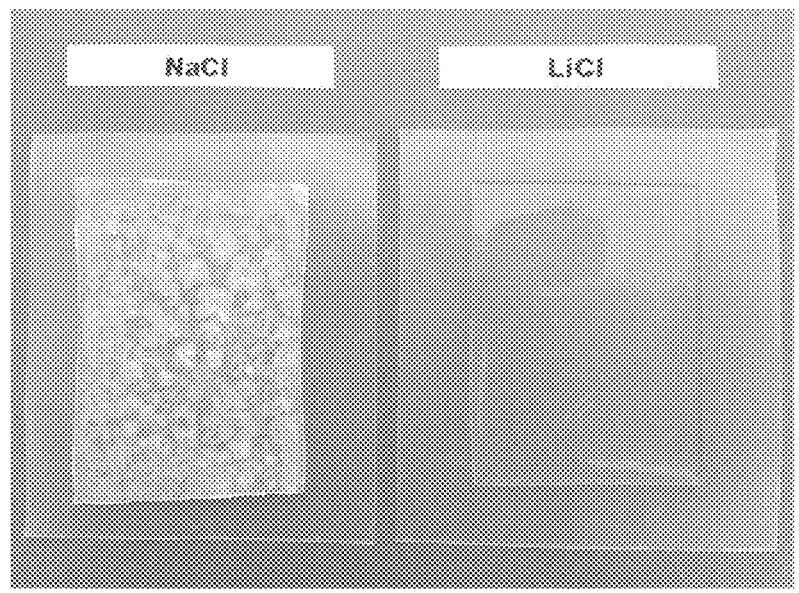
FIG. 5. The ionic liquid was chosen primarily based on chemical stability at ambient conditions. Here our acrylamide hydrogel electrode is shown swelled in aqueous NaCl and LiCl following exposure to ambient conditions for 48 hours. These samples are not encapsulated in silicone; the lack of salt precipitation in the LiCl sample owes to its higher ionic strength.
Figure 6:
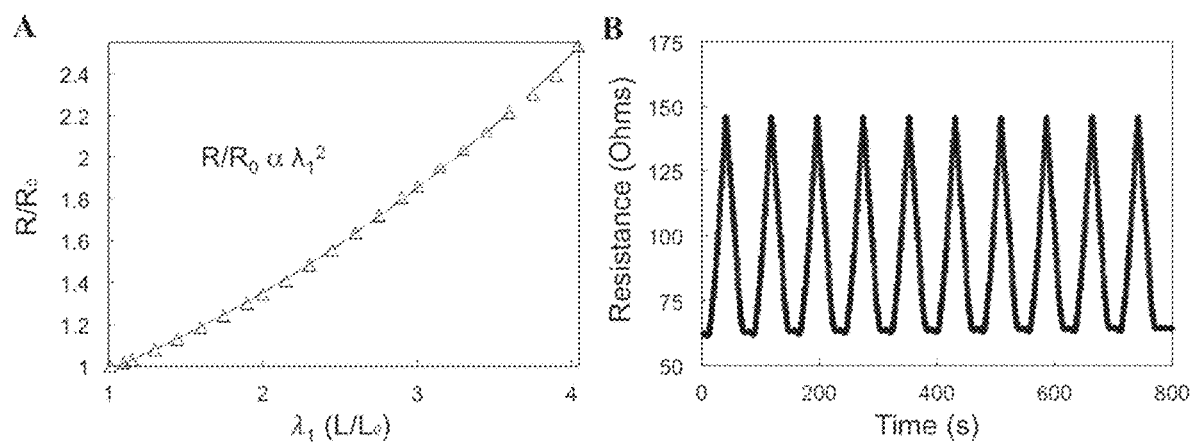
FIG. 6. Graphs illustrating electrical resistance of a hydrogel electrode under deformation. (A) The relative change in hydrogel resistance (R/R0) increases with uniaxial strain (n=5; standard deviation within markers). The relative change in resistance scales with $\lambda 2$ (note: $\lambda=\varepsilon+1$) (least-squares fit=0.9996), and is consistent with recently reported conductive acrylamide hydrogel chemistries. (B) The hydrogel under cyclic loading, showing a high degree of repeatability.

The HLEC (FIG. 1B) is a five-layer structure consisting of a dielectric electroluminescent layer that is sandwiched between two electrodes and encapsulated in low elastic modulus ($G'\sim 30$ kPa) silicone (Ecoflex 00-30, Smooth-on Inc.). Each of these layers is not only highly extensible, but highly compliant (FIG. 1C), even more so than octopus skin ($G'\sim 20$ MPa). Application of an AC field (25 kV cm$^{-1}$; 500-1000 Hz) causes luminescence within the EL layer at wavelength centers corresponding to the characteristic excitation energies of the semiconducting phosphor. Here, 25 µm ZnS particles doped with various transition metals were used to produce different colors. High and low copper ratios emit green (~500 nm) and blue (~460 nm) light, respectively, while copper and manganese combined emit orange (~580 nm). White was produced via blends of the preceding three types. The EL layer was formed by mixing the phosphor powders (~8% by volume) into silicone (Ecoflex 00-30) and then molding the dispersion into to a 1 mm-thick sheet. The disclosed hydrogel electrodes are designed with a balance of high mechanical toughness, chemical stability (see FIG. 5), and low electrical resistance under deformation (see FIG. 6). Aqueous lithium chloride (LiCl) was used as the conducting medium due to its high conductivity (~10 S m$^{-1}$), ionic strength, and hygroscopic nature, while polyacrylamide was used as the elastomeric matrix for its high toughness and optical transparency. The electrodes were synthesized by dissolving acrylamide monomer, polyacrylamide, and N,N'-methylenebisacrylamide crosslinker in aqueous LiCl and then casted the solution onto a UV-ozone treated silicone (Ecoflex 00-30) substrate. The hydrogel was then polymerized and crosslinked under UV light (see SI Text 3). Finally, the EL layer was bonded between the two electrode patterned silicone substrates and encapsulated the capacitor in an insulating layer of silicone.

Figure 7A:
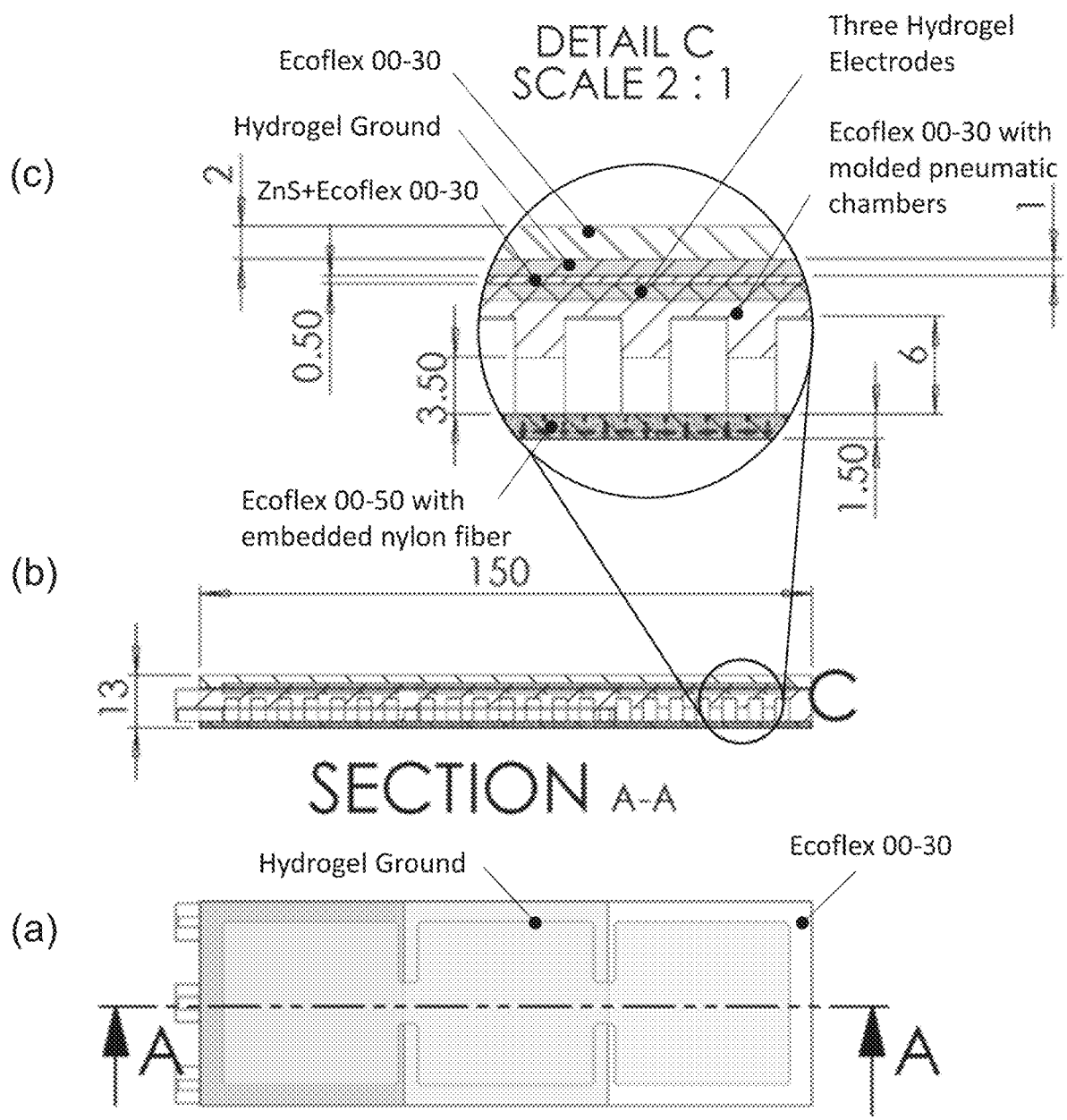
FIGS. 7A, 7B, and 7C. The pneumatic actuator design consists of i) a doped Zn:S phosphor-Ecoflex 00-30 composite (~7.8 vol. % phosphor), ii) a top layer of hydrogel (continuous sheet that serves as the ground) and a bottom array of three independently powered hydrogel electrodes that sandwich the center EL layer, iii) three independently actuated pneumatic chambers with geometries shown in the section view, iv) a bottom layer comprised of an inextensible layer of woven nylon fiber-Ecoflex 00-50 composite, and v) an outer layer of Ecoflex 00-30 that encases the entire structure.
Figure 7B:
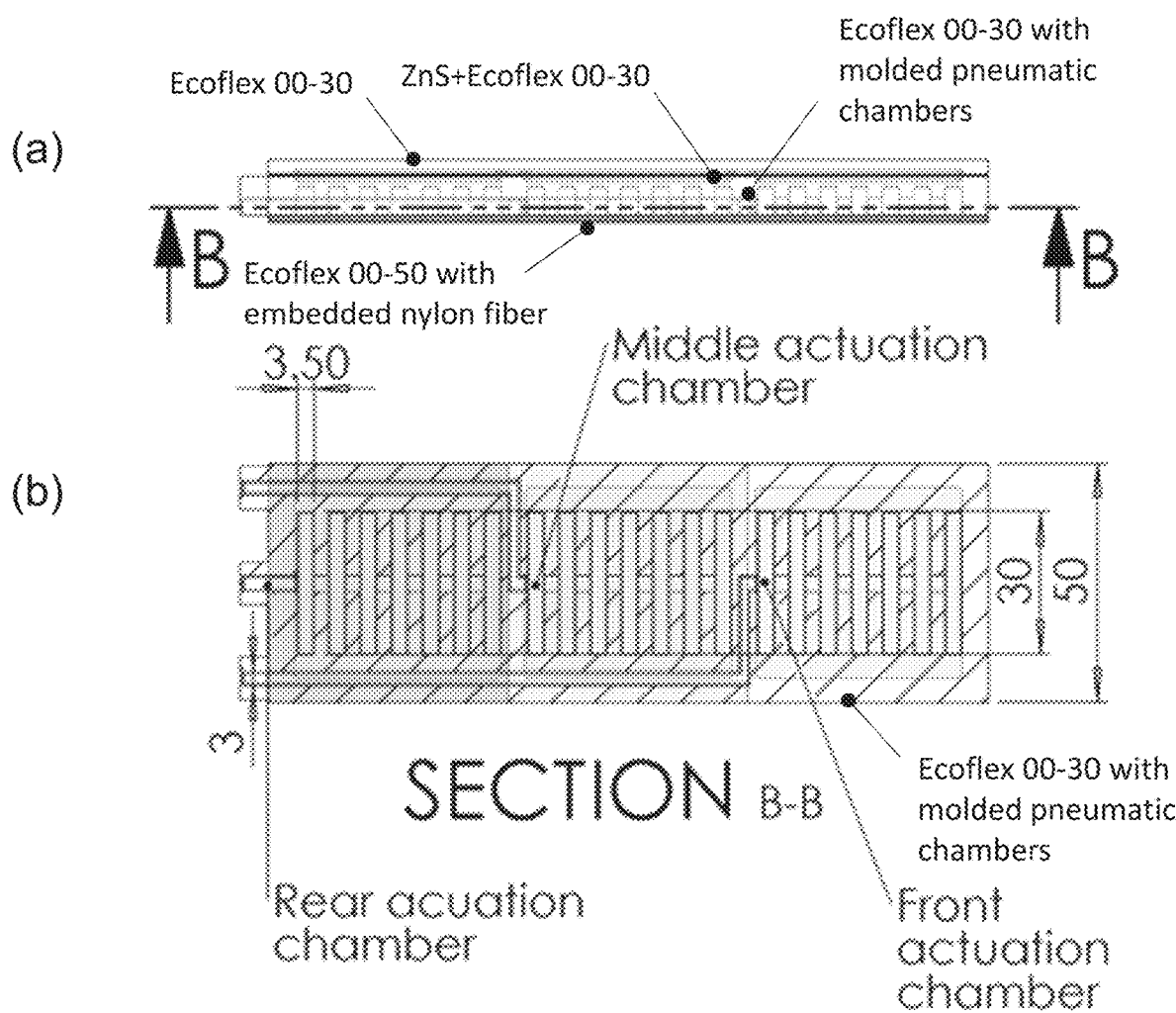
Figure 7C:
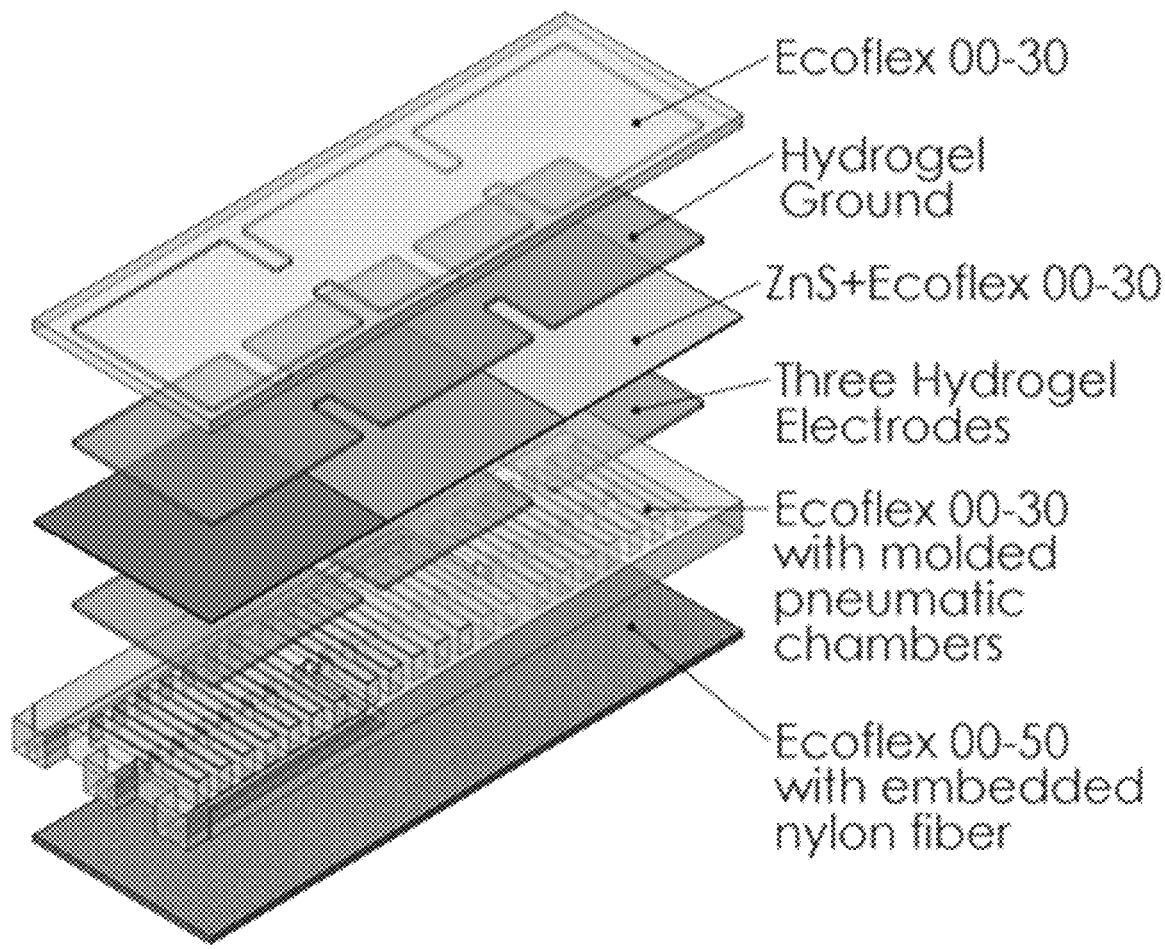

The resulting HLEC was integrated into a crawling soft robot by bonding six layers together. The top four layers comprise the electroluminescent skin, while the bottom two are the pneumatic actuator. The pneumatic actuator design was designed for various mobile soft robots, though other variations are known in the art. The pneumatic actuator is a series of inflatable chambers embedded in silicone with a bottom layer comprised of inextensible fiber-elastomer composite. Inflation of the pneumatic chambers causes stretching of the HLEC. As the inextensible layer does not stretch, there is a net bending moment that is exploited to create continuous actuation modes mimicking the natural motion of animals. The inextensible layer is a woven nylon sheet (9318T18, McMaster-Carr Supply Co.) encased in a layer of tough silicone (Ecoflex 00-50, Smooth-on Inc.), while the upper extensible layer (Ecoflex 00-30) contains a series of three independently controlled chambers (design shown in FIG. 7). The HLEC array was integrated into the robotic layer by patterning the bottom electrode reservoirs onto the top of the pneumatic layer (FIG. 1B).

The stress-strain curves of the HLEC and its silicone-containing layers (Ecoflex and Ecoflex-EL composite) are all coincident, while the elastic modulus of the hydrogel is two orders of magnitude lower, allowing the HLEC to stretch freely without delaminating. Mechanical testing data (FIG. 1C) and images (FIG. 2A) show the excellent chemical and physical bonding between the layers that allows the HLEC to remain luminescent up to a stretch ratio, $\lambda_1$, of ~5.85 ($\varepsilon \approx 485\%$; $\lambda=\varepsilon+1$) under boundary conditions that approximate uniaxial tension. The HLEC operates under a relatively high electric field (~25 kV cm$^{-1}$, unstretched), but at low current (~1.6 mA) and power (~2.9 W). In all the tests, device failure was caused by poor electrical contact between the external Cu leads and the hydrogel electrodes. With an improved lead-electrode interface design, the HLEC will be able to stretch up to the ultimate strain of the silicone as the high dielectric strength of the matrix, $E_B > 200$ kV cm$^{-1}$ (38), should prevent dielectric breakdown from occurring.

Figure 8:
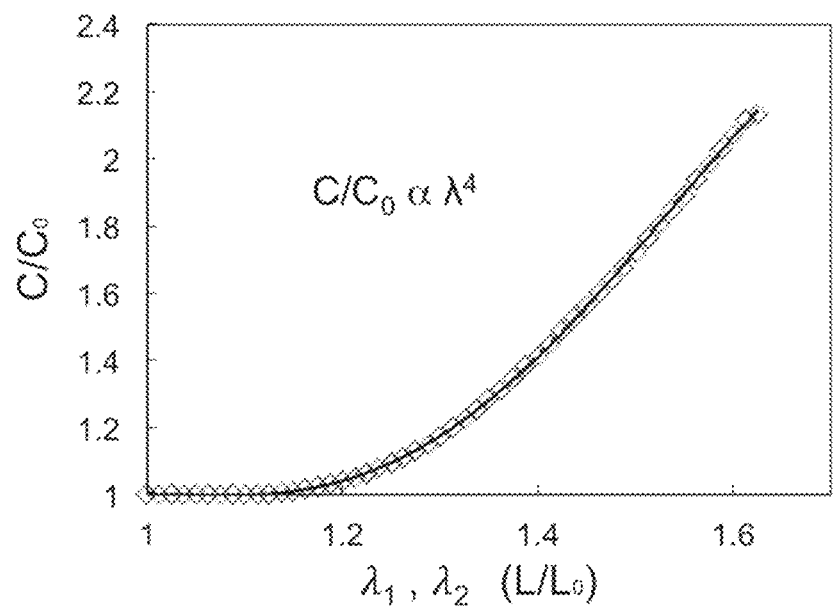
FIG. 8. The behavior of the HLEC's capacitor in equibiaxial tension showing the $\lambda$ 4 dependence of C/C0 in equibiaxial tension that is predicted in section T1 (least-squares fit=0.9999) (note: $\lambda=\varepsilon+1$).

The HLEC display is a parallel plate capacitor, $C \propto A\, d^{-1}$, and thus can also sense deformations from pressure and stretching as the electrode area (A) and separation distance (d) change. This capacitance (C) change was modeled by expressing A and d in terms of the principal stretches, $\lambda_1$, $\lambda_2$, and $\lambda_3$, which represent the axial, transverse, and in-plane orientations, respectively (note: $\lambda=\varepsilon+1$). Section T1 derives the relative change in capacitance for equibiaxial tension ($C/C_0 \propto \lambda^4$). These predictions are consistent with the measured values (FIG. 8).

Figure 2:
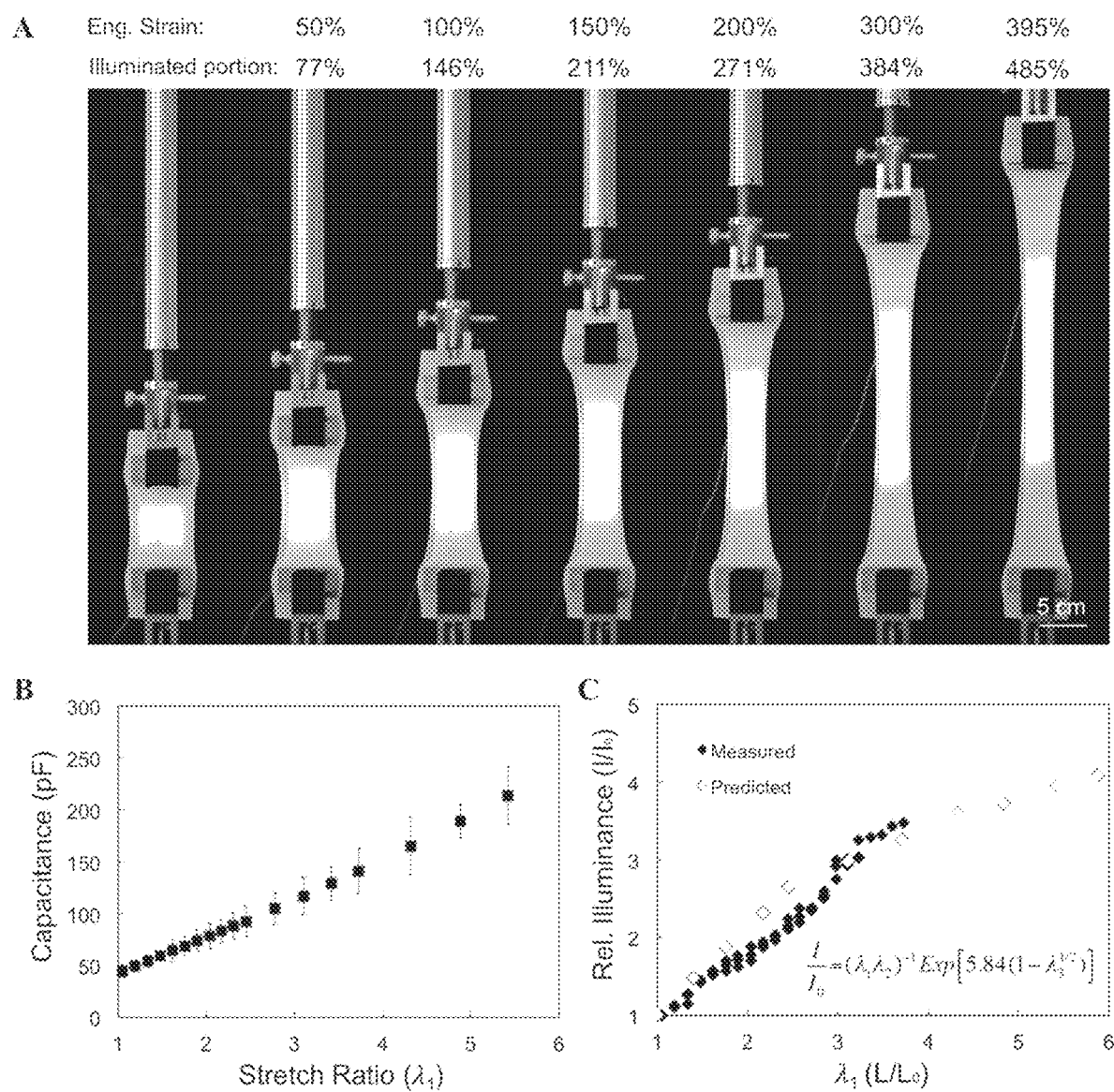
FIG. 2. The capacitive and luminescent behavior of the HLEC display under uniaxial stretching: (A) an HLEC under a nominal electric field of ~25 kV cm-1 (in the unstretched state) being stretched up to ~485% strain (mechanical data shown in FIG. 1C), (B) the capacitance of the HLEC as a function of uniaxial strain (of the illuminated portion) (n=4), and (C) the relative illuminance of the HLEC as a function of uniaxial strain (of the illuminated portion) (n=4) showing general agreement with the values predicted from Eq. 1. For practical reasons, the illuminance was only measured up to a stretch ratio of ~4.

An increase in luminescence as the capacitor is stretched was observed. This change mimics a cephalopod's ability to modulate the light intensity within their skin by expanding sacks of ink using chromatophores. The HLEC's ability to modulate its intensity can be attributed to two interrelated phenomena, though other mechanisms are possible. First, the increase in electric field (E) as d decreases. Second, the decrease in areal number density of phosphor particles (n) as A increases. Starting with the classic voltage-luminescence relationship for high-field AC electroluminescent phosphors (Eq. 8), the scaling law shown in Equation 1 is predicted by expressing $E/E_0$ as a function of the principal stretches and by correcting for the change in n with stretching ($n \propto A_0/A$; see Section T2 for derivation). The predicted trend is in general agreement with luminescence measurements that were made in uniaxial tension (FIG. 2C).

$$\frac{I}{I_0} = (\lambda_1\lambda_2)^{-1}\text{Exp}[5.84(1-\lambda_3^{1/2})] \qquad \text{Eq. 1}$$

Figure 3:
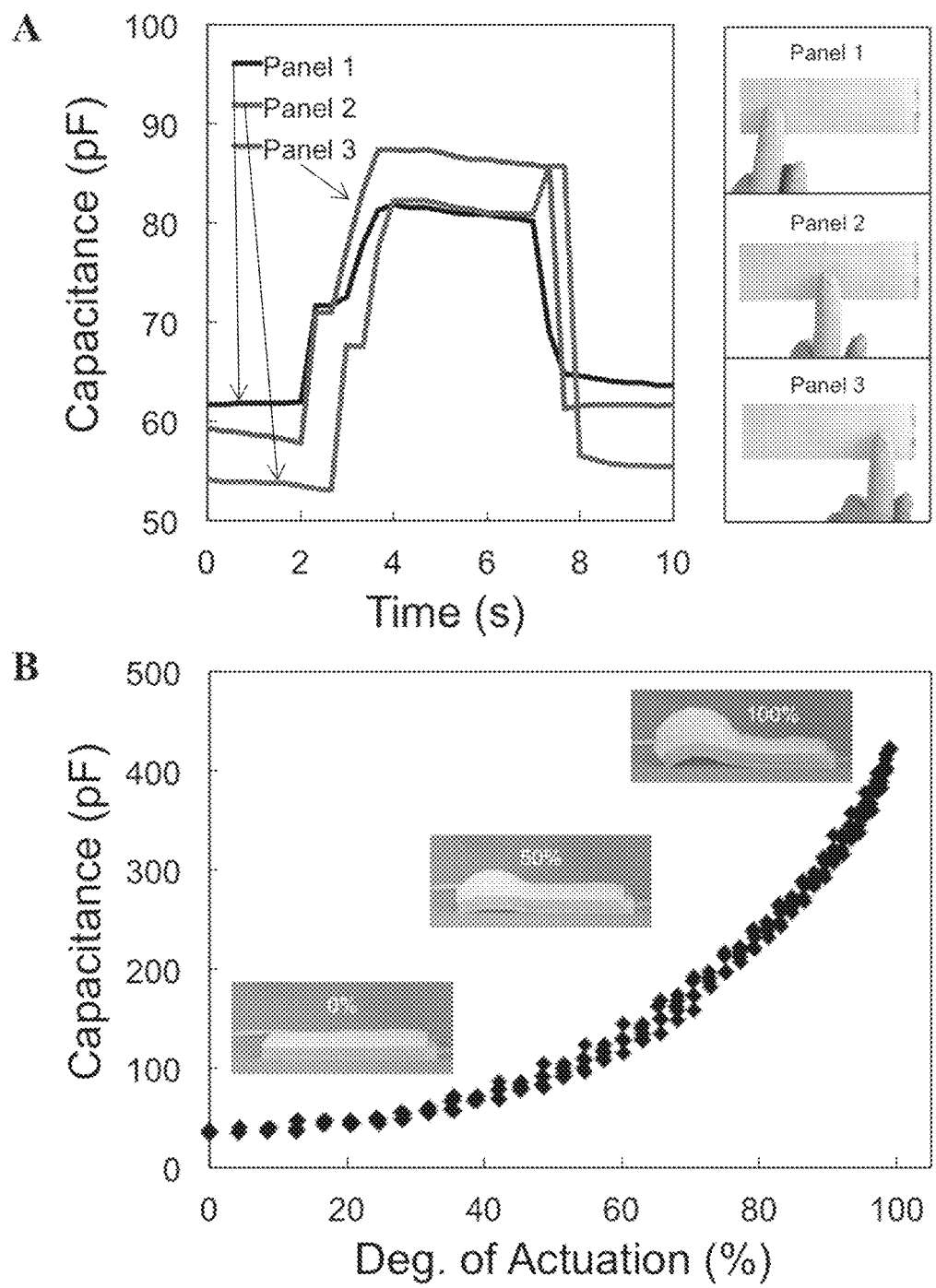
FIG. 3. Electroluminescent skins act as sensors that provide proprioceptive and exteroceptive feedback: (A) Exteroception: an array of sensors positioned in the electroluminescent skin gives it the ability to sense touch via changes in capacitance. Pressing these sensors with moderate force (~5 N) induces a ~25% increase in the capacitance. (B) Proprioception: actuation of the robot induces a 500-1000% change in the capacitance. Capacitance is plotted versus the actuation amplitude, which is the fractional change in deflection between the rest and fully actuated states (shown as a percentage). This data consists of five measurements overlaid (taken on the same sample).
Figure 9:
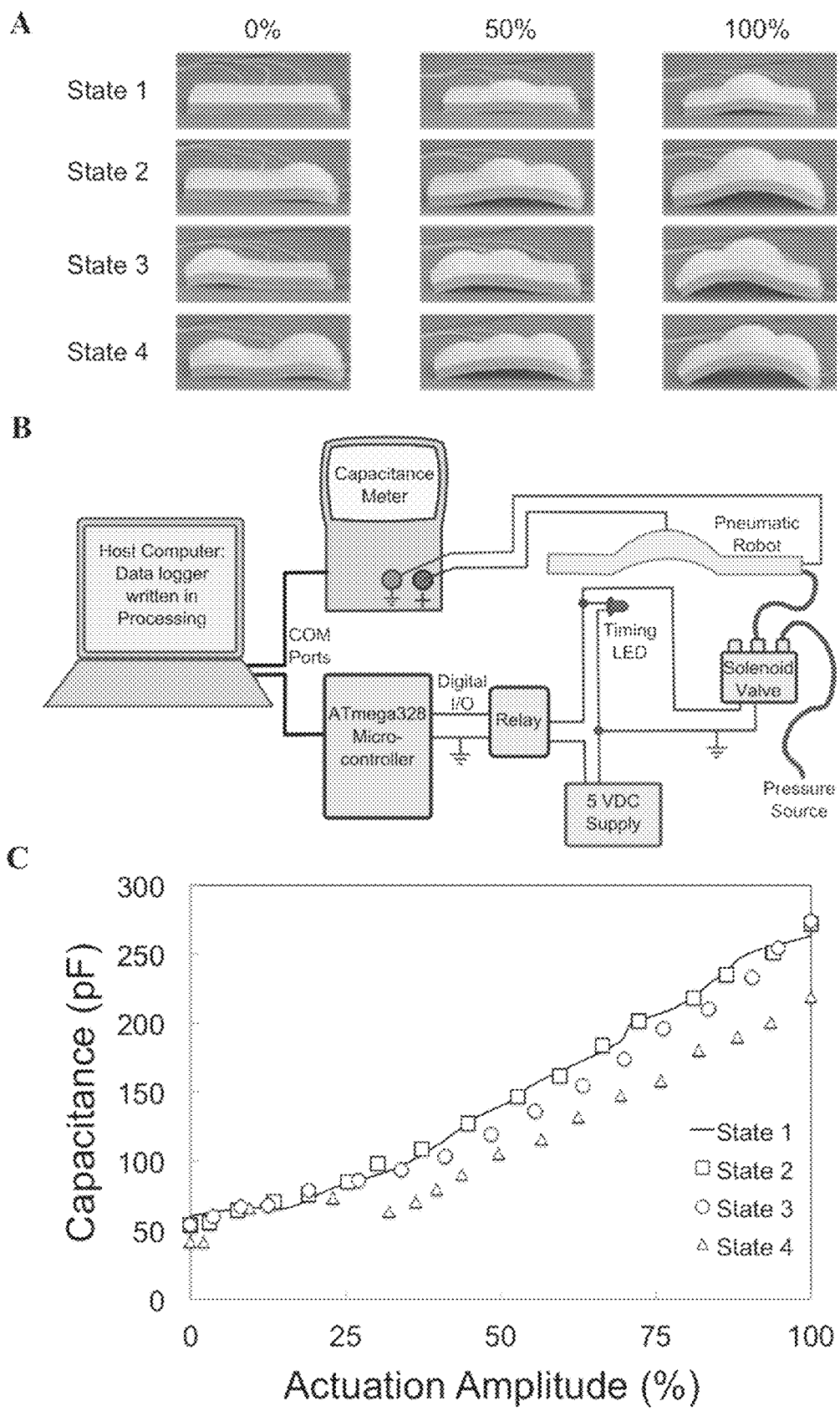
FIG. 9. A testing apparatus and exemplary results. (A) The capacitance of the center HLEC panel is measured as a function of actuation amplitude (of the center pneumatic chamber) for various system states. These states are shown visually; State 1: left and right panels non-pressurized, State 2: left panel non-pressurized, right panel pressurized, State 3: left panel pressurized, right panel non-pressurized, and State 4: left and right panels pressurized. (B) Experimental setup for measuring capacitance as pneumatic chambers are inflated. A program written in the Processing program language coordinates data retrieval from the capacitance meter and control of a solenoid valve to pressurize pneumatic chambers. An LED is simultaneously illuminated to aid with timing the video footage to the release of the solenoid valve. (C) The plot shows the capacitance of the center HLEC as a function of the actuation amplitude of the center pneumatic chamber for each of the four states. The capacitance behavior is largely independent of the actuation level of neighboring chambers, enabling HLECs to be used as proprioceptive sensors.
Figure 10:
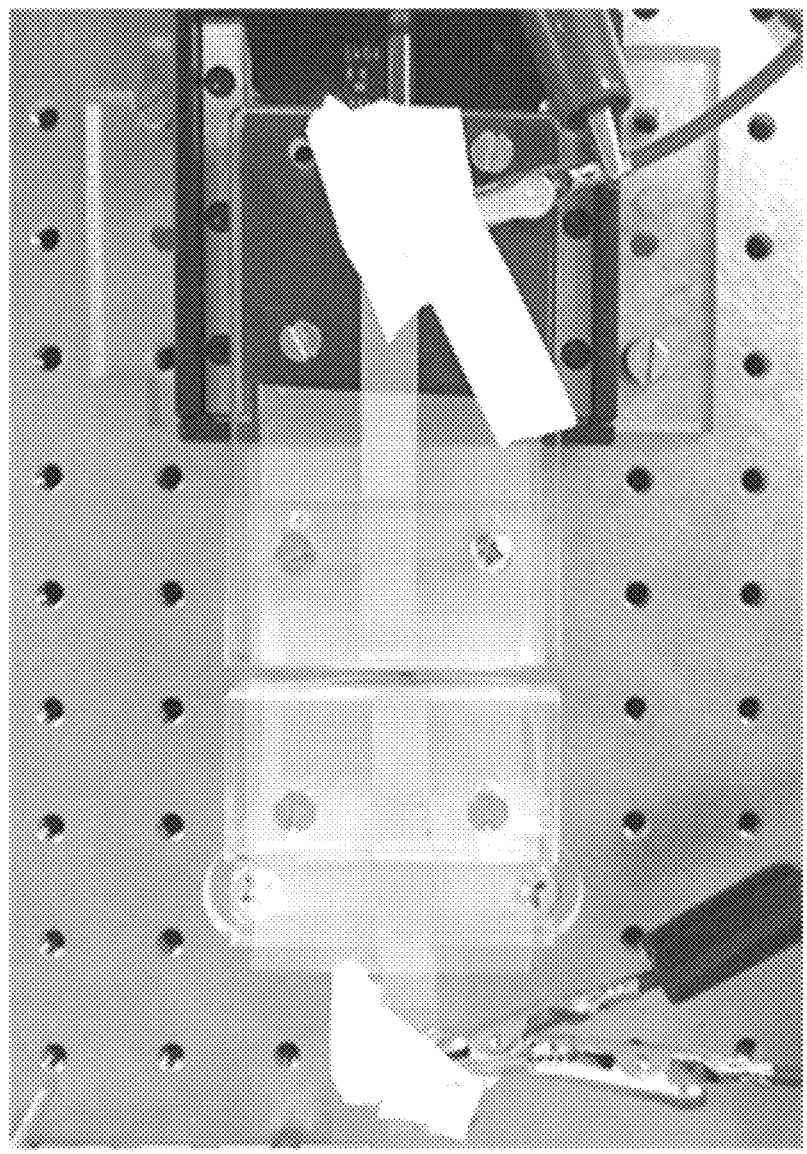
FIG. 10. Biaxial stretching experiment showing the HLEC in the (A) unstretched and (B) stretched states. The strain is implemented by means of two precision linear translation stages put at 90° each other. During stretching, the capacitance was measured by means of a precision LCR meter.

Capacitive measurements also allow sensory information from the HLEC to be interpreted. FIGS. 3A-3B show the change in capacitance resulting from externally applied pressure and pneumatic actuation, respectively. Application of external loads by pressing on the surfaces of the three HLEC panels leads to a repeatable increase in capacitance ($\Delta C\sim 25\%$). Capacitance changes of this magnitude provide sensory feedback that, when patterned in appropriate locations on the robot, enable exteroception. Meanwhile, actuation of the three underlying pneumatic chambers results in a much larger capacitance change ($\Delta C\sim 500\text{-}1000\%$). An important feature of the disclosed electronic skin is that each of its sensors are highly sensitive to the actuation of the underlying pneumatic chamber, but largely decoupled from the state of the surrounding pneumatic chambers (see FIG. 9). The ability to identify the actuated state by cataloging unique sets of capacitive readouts endows the machine with proprioception.

Figure 4:
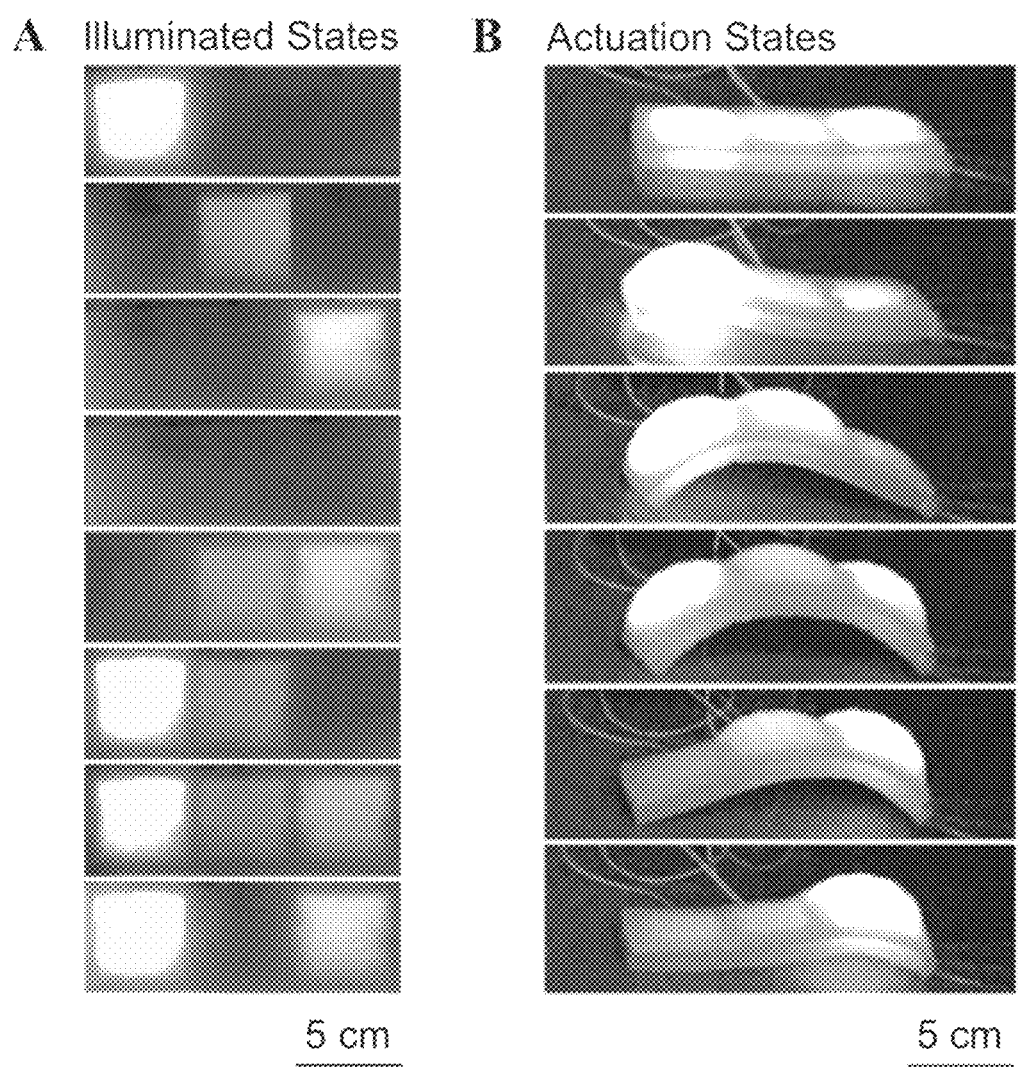
FIG. 4. Soft electroluminescent skins are patterned using replica molding and soft lithography, thereby producing pixels in arbitrary patterns and geometries. (A) Here a simple array of three pixels is shown, each emitting a different wavelength through selective doping of the EL phosphor layer. Each pixel can be activated independently to produce spatial patterns and temporal signaling. (B) A soft robot equipped with an HLEC display undergoing an actuation cycle to produce locomotion. As each pneumatic chamber is actuated, the outer electroluminescent skin is stretched, resulting in a higher electric field and, thus, increased luminescence.

FIG. 4A shows a simple array of three pixels patterned into a three-chambered crawling robot; these pixels enable eight distinct illuminated states. FIG. 4B shows that the embedded HLEC remains functional as the robot is actuated through its crawling sequence. During actuation, the embedded HLEC undergoes stretches of $\lambda_1=2.63$ and $\lambda_2=2.42$ in the longitudinal (front to rear) and transverse (side to side) directions, respectively, to produce an approximately 635% increase in the skin's surface area (FIG. 13), reproducing the extensibility of cephalopod skin. Similar to the one-pixel HLEC shown in FIG. 2A, the luminescent intensity of the embedded skin also increases during actuation from compressive strains along its thickness.

Synthetic skin for dynamic coloration and sensing that still allows large shape changes from underlying machines and wearers is a step towards replicating the abilities of cephalopods. These abilities were demonstrated by patterning intrinsically soft displays into elastomeric, pneumatic actuators. HLECs are an attractive option for soft robotics given their low cost, facile fabrication, and high extensibility, which exceeds the highest reported LED-based displays by more than 350%. The disclosed HLEC array, however, is presently a low-resolution display of three pixels. The *Sepia officinalis*, by contrast, has a much higher display resolution owing to its high chromatophore density ($\sim 35\text{-}50$ mm$^{-2}$). By switching to photo-polymerizable silicones, HLECs can be made compatible with microfabrication techniques. Doing so should enable pixel densities approaching that of a cuttlefish. Patterning such high densities of HLECs into devices, however, will make interfacing with and controlling the display difficult. Although many of the details remain unclear, cephalopods control their display patterns though visual stimuli from the optic lobes that trigger the *suboesophageal ganglia*. Recent work demonstrating automatic pixel control using photodiodes may enable autonomous dynamic camouflage using HLECs. There is likely a limit to how dense the pixels can be patterned while maintaining suitable control over the display, but such a limit may still allow the display to be used.

In addition to increasing pixel resolution, photolithography will allow a decrease to the thickness of the electroluminescent layer, thereby reducing the voltage required for an equivalent field gradient to power the HLEC. Even with the present voltage requirements, the device requires only 2.9 W and could potentially be powered by commercially available EL inverters. In combination with presently available soft robots, these skins could therefore be powered and controlled without the use of electrical tethers. Although soft robots and bio-inspiration are disclosed herein, HLECs can also be used more broadly in the field of robotics, and in the future may find use in consumer applications ranging from wearable sensors and displays, to fashion and clothing. It is expected that challenges associated with implementing this system more broadly (e.g., hydrogel volatility, electrical safeguards) can be met by, for example, improved electrical encapsulation strategies, the use of non-volatile stretchable and transparent electrodes, and device miniaturization.

T1—Capacitance Versus Strain

The capacitance of a parallel plate capacitor in the stretched (C) and unstretched (C0) states scales according to Eq. 2 and Eq. 3, respectively. This basic model is used to understand how the capacitance changes in the HLEC.

$$C \alpha \frac{A}{d} \qquad \text{Eq. 2}$$

$$C_0 \alpha \frac{A_0}{d_0} \qquad \text{Eq. 3}$$

For uniaxial stretching, the fractional change in the electrode area (A) and separation distance (d) are approximated using Eq. 4 and Eq. 5, respectively. Here, $\lambda 1$, $\lambda 2$, and $\lambda 3$ represent the axial, transverse, and in-plane stretches of the illuminated portion of the HLEC. Still-frames extracted from video taken of the uniaxial tension test (shown in FIG. 2A) were measured in Image-J to determine $\lambda 1$ and $\lambda 2$, and then the condition of incompressibility (Eq. 6) was invoked to determine $\lambda 3$.

$$A = A_0\lambda_1\lambda_2 \qquad \text{Eq. 4}$$

$$d = d_0\lambda_3 \qquad \text{Eq. 5}$$

$$\lambda_1\lambda_2\lambda_3 = 1 \qquad \text{Eq. 6}$$

Combining Equations 2-6 yields the scaling law for the capacitance of the HLEC (Eq. 7).

$$\frac{C}{C_0} = \lambda_1^2\lambda_2^2 \qquad \text{Eq. 7}$$

To compare our scaling law with the actual capacitance of the HLEC, equibiaxial boundary conditions ($\lambda 1=\lambda 2$) were used to obviate image analysis and the need to account for necking. The measured capacitance in equibiaxial tension is shown in FIG. 8, revealing the expected $\lambda 4$ dependence.

T2—Intensity Versus Voltage and Strain

Figure 12:
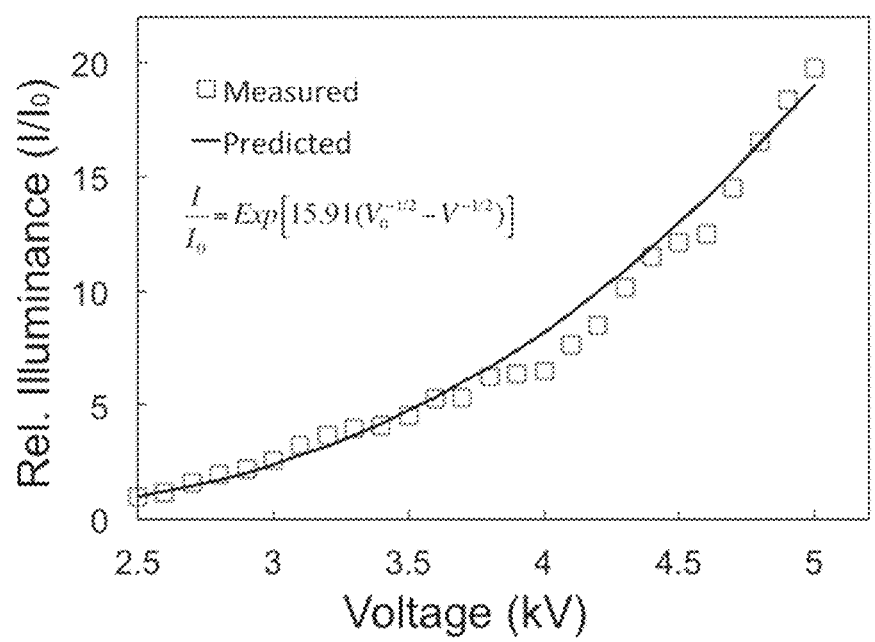
FIG. 12. The luminescence behavior of the HLEC, showing the relative illuminance (HO) at a constant frequency (700 Hz) in the pre-stretched state ($\varepsilon$=135%). The measured values are in general agreement with the classic voltage-intensity relation that is predicted from the bipolar field emission model (Eq. 8, b=15.91).

Here, the classic luminescence-voltage relationship from the bipolar field emission model is used to predict how the illuminance changes as a function of stretching in uniaxial tension. We start with Equation 8, which expresses the relative illuminance ($I/I_0$) as a function of applied voltage (V; $V_0$ represents the starting voltage corresponding to $I_0$). FIG. 12 compares the predicted and measured scaling behaviors ($I/I_0$ vs. V). The HLEC exhibits the classical behavior in accordance with Eq. 8 (with b=15.91).

$$\frac{I}{I_0} = \text{Exp}[b(V_0^{-1/2} - V^{-1/2})] \qquad \text{Eq. 8}$$

A goal is to express Eq. 8 in terms of the principle stretches along the axial, transverse, and in-plane directions in our uniaxial tension test ($\lambda 1$, $\lambda 2$, and $\lambda 3$, respectively). First, the voltage terms are replaced with electric field, E, using the relation $E=V d-1$ to yield Eq. 9.

$$\frac{I}{I_0} = \text{Exp}[b((E_0 d_0)^{-1/2} - (Ed)^{-1/2})] \qquad \text{Eq. 9}$$

Where $E_0$ represents the nominal electric field (~2.5 kV cm$^{-1}$). Eq. 5 is then invoked to obtain the desired expression (Eq. 10), where $a=b/(E_0 d_0)^{1/2}$.

$$\frac{I}{I_0} = \text{Exp}[a(1 - \lambda_3^{1/2})] \qquad \text{Eq. 10}$$

The change in areal number density of EL particles, n, as the electrode area, A, increases is accounted for. This may affect the illuminance inversely according to the following scaling law:

$$\frac{I}{I_0} \alpha \frac{\eta}{\eta_0} \alpha \frac{A_0}{A} \qquad \text{Eq. 11}$$

Combining Equations 4, 10, and 11 yields the relative change in intensity as a function of physical parameters that can be measured in the uniaxial tension test (i.e., Eq. 1):

$$\frac{I}{I_0} = (\lambda_1 \lambda_2)^{-1} \text{Exp}[a(1 - \lambda_3^{1/2})] \qquad \text{Eq. 12}$$

The illuminance was measured in uniaxial tension using a portable light meter (Model HHLM 1337; Omega Engineering Inc.). The aperture was fixed and the sensor was held at a fixed distance (~5 mm) from the center of the HLEC. The results are shown in FIG. 2C, and are in general agreement with Equation 12 (a=5.84 for HLEC and test conditions). For practical reasons, the illuminance could only be measured up to a stretch ratio of ~4.

T3—Materials and Methods

Materials. The HLEC and biped robot are composed of fully soft materials including Ecoflex 00-30 (Smooth-On Inc.) elastomers, polyacrylamide based LiCl hydrogel electrodes, and transition metal-doped ZnS phosphors (Global Tungsten & Powders Corp.) embedded in Ecoflex 00-30 as the active display material. Hydrogels are synthesized using acrylamide (AAm; Sigma-Aldrich) and polyacrylamide (PAM, Mw ~5×10$^6$) (92560; Sigma-Aldrich) swelled in aqueous LiCl (LiCl; Alfa Aesar) along with a crosslinker (N,N'-methylenebisacrylamide or MBAA; Sigma-Aldrich) and a photoinitiator (Irgacure 1173; BASF). AAm and LiCl are dissolved in deionized water at a concentration of 1.75 M and 8 M, respectively, followed by PAM at a weight ratio of 0.142 PAM:AAm. The solution is mixed on a magnetic stirrer/hot plate at 60° C. for 4 hours, and then MBAA and Irgacure 1173 are added at a weight ratio of 0.01 and 0.016:AAm, respectively. Mixing for two additional hours yields the uncured hydrogel electrode material.

Hyperelastic Light-Emitting Capacitor (HLEC). The synthetic skin is fabricated using replica molding. The outer layers (see FIG. 1B) are formed by casting Ecoflex 00-30 into 3D printed molds (Objet 30; Stratasys Ltd.) followed by curing at 80° C. for 20 minutes. The bonding surfaces are then treated with UV-ozone for 10 minutes. The uncured hydrogel is infused into the 1 mm electrode relief pattern and then cured for 15 seconds under UV light (320-500 nm, 200 W) (Model S1500; Lumen Dynamics) to create the top and bottom electrodes. The EL layer is formed by mixing electroluminescent phosphor powders with Ecoflex 00-30 (7.8 wt. % phosphor) (Global Tungsten and Powder Corp.), and then casting it into the 1 mm relief pattern followed by additional curing at room temperature. The entire structure is encapsulated in Ecoflex. The resulting device has a total thickness of 8 mm with staggered electrodes that enable connection to external power source.

HLEC integrated crawling soft biped robot. Synthetic skins are incorporated into the biped by fusing the HLEC into the top of pneumatic actuators. Pneumatic chamber replicas (design shown in FIGS. 7A, 7B, and 7C) were printed on an Objet 30. Three independently controlled inflatable chambers actuate the front, middle, and rear sections of the robot. The extensible top layer contains separate reservoirs for each of the three bottom electrodes, while the bottom is bonded to an inextensible elastomeric composite consisting of Ecoflex 00-30 and woven nylon sheet. The top electrodes and encapsulation layers are then added using the same methods that are used for the HLEC.

Capacitance and Luminescence of HLEC v. stretching. Capacitance was also measured under uniaxial stretch by connecting a capacitance meter (830C; BK Precision) to the hydrogel electrodes. Measurements were recorded under both uniaxial and biaxial stretching conditions. Luminescence of the HLEC was observed and measured under uniaxial stretching using a mechanical tester (Z010; Zwick Roell) and a portable light meter (HHLM 1337; Omega Engineering Inc.). Specimens were mounted on the machine, connected to an AC voltage source (2.5 kV, 700 Hz), and subjected to uniaxial tension. A high-voltage amplifier (610 D; TREK Inc.) coupled with a function generator (3312 A; Hewlett Packard) was used to power the HLEC. All tests were operated at a current of ~1.6-2.3 mA, resulting in an averaged power consumption of 2.9 W. A strain rate of 100% min-1 was used in all tests. The gage strain was recorded using the controller software, while the strain within the luminescent area was measured using real-time imaging of fiducial marks. The illuminance was measured by placing the light-meter ~5 mm from the center of the luminescent area with a shield to block interference from ambient light.

Exteroception and proprioception of electroluminescent skin. Capacitance measurements were also taken on the electroluminescent skin embedded on the soft biped robot. The top and bottom hydrogel electrodes were connected to the capacitance meter. A program written in Processing, running on a laptop computer, was used to communicate with the capacitance meter and an ATmega328 microcontroller (Arduino Uno R3; Adafruit). This program coordinates data retrieval and logging from the capacitance meter with control of a solenoid valve. The solenoid valve is activated using a signal from the ATmega328 is used to precisely time the input of pressurized air into the actuator. The testing apparatus is shown in FIG. 9B. Pressure from human touch was measured on individual panels. The applied force was manually controlled by simply pressing each panel (see FIG. 3A). Capacitance measurements were also taken on the panel as each of the underlying pneumatic chambers was pressurized (compressed air, 7 psi, ~48 kPa).

The degree of actuation was arbitrarily defined based on morphology of the undulation, which were controlled using input pressure and time.

Crawling and glowing of HLEC integrated soft biped robot. Crawling involved six steps, starting from the rest state. These steps included: (i) pressurizing rear chamber pulled the rear of the biped up (this motion anchored the robot from sliding back); (ii) pressurizing the middle chamber lifted the spine of the robot from the ground; (iii) pressurizing the front chamber pulled the front forward; (iv) depressurizing rear chamber glided the rear forward; (v) depressurizing middle chamber impelled the gliding; and (vi) depressurizing front chamber propelled the entire body of the robot forward. Each actuation was driven by a nominal pressure of 4.7 psi (~32 kPa). This sequence produces forward locomotion at a speed of ~4.8 m $hr^{-1}$ (~32 body lengths $hr^{-1}$). Panel illumination during crawling was powered by an amplifier (610 D; TREK Inc.) with electrical leads tethered along with the air tubes. The three panels were then individually switched and controlled to demonstrate eight distinct states of illumination (FIG. 4A). During the actuation, the intensity of luminescence raised dramatically (FIG. 4B) due to the compressed dielectric EL layer.

Biaxial stretching of HLEC. Biaxial stretching was performed using a pair of stepper motor translation stages with crossed roller bearings (M-126 Servo; PI) in the x-y plane. The stages were driven by Mercury Servo controllers (C-863; PI). The capacitance was measured using precision LCR meter (E4980A; Agilent) and recorded in LabVIEW along with the accompanying strain data.

Figure 11:
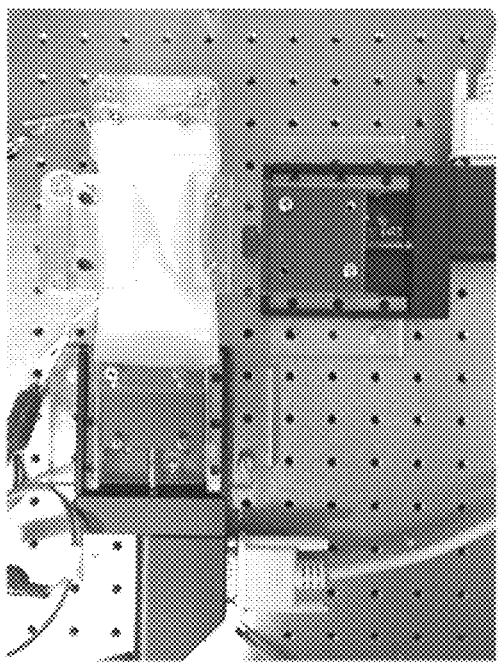
FIG. 11. Hydrogel electrode resistance measurement; a precision linear translation stage applies the strain, while the resistance is measured using a precision LCR meter.
Figure 11:
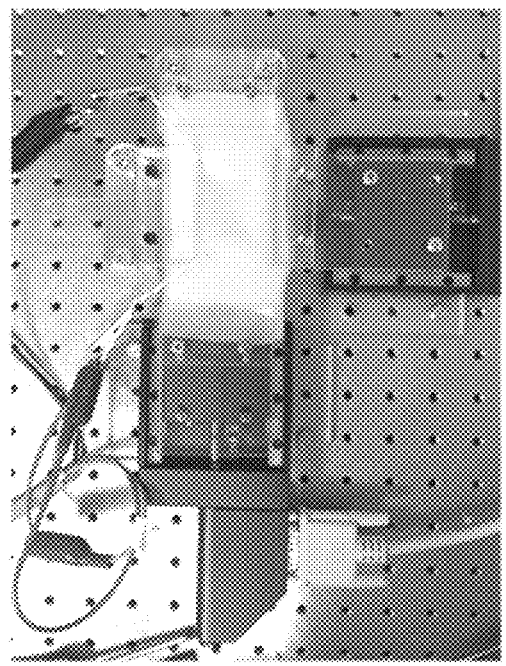
Figure 13:
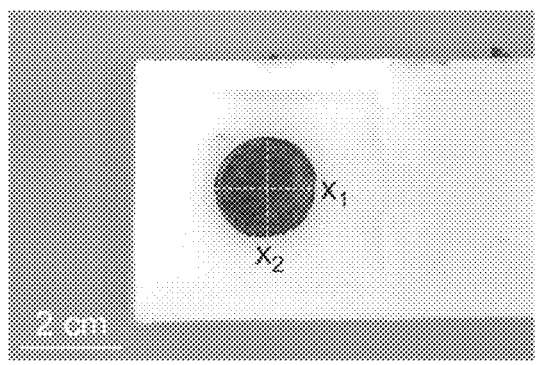
FIG. 13. Deformation of the electroluminescent skin during actuation of the robot. The principal stretches, $\lambda_1$ and $\lambda_2$, which correspond to the longitudinal ($x_1$) and transverse ($x_2$) directions, respectively, were measured as the robot was actuated through the crawling sequence (sequence shown in FIG. 4B). A circular fiducial mark was placed on Panel 1 and its diameter along the $x_1$ and $x_2$ directions was measured using a compliant measuring tool. The principal stretches shown in this figure are $\lambda_1$=2.63 and $\lambda_2$=2.42 (note that these measurements account for out-of-plane deformation that is not captured in this 2D image). We observe that the surface area of the ellipse in the deformed state is ~635% larger than the nominal circular fiducial mark in the rest state ($A/A_0=\lambda_1\lambda_2$).
Figure 13:
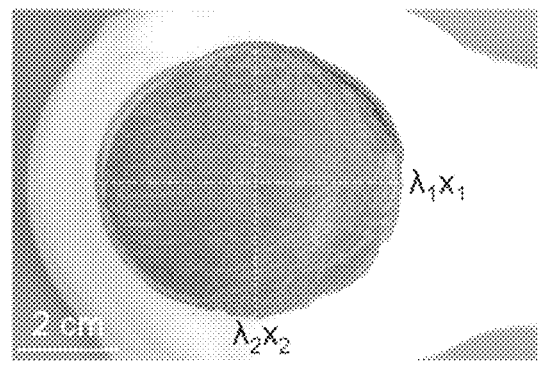

Resistance of hydrogel electrode under uniaxial strain. The resistance of hydrogel was examined under uniaxial strain using a precision LCR meter (setup shown in FIG. 11). All measurements were conducted with a 5 mm gage length on hydrogel electrodes containing 8 M of LiCl. The nominal (or unstretched) resistance was 59.96±1.93Ω, while at 300% strain it increased to 144.33±4.99Ω. The cyclic resistance variation of the electrodes was examined by measuring resistance over 10 successive stretching cycles. Negligible resistance variation was observed (FIG. 13).

Illuminance of HLEC as a function of voltage. The illuminance (luminous flux per unit area of light, measured in lux) of HLEC was measured using a light meter (HHLM 1337; Omega Engineering Inc.). Samples were mounted on the tensile tester (Z010; Zwick Roell) in pre-stretched state (ε=135%) and connected to external voltage source. Illuminance was measured as a function of voltage (at 700 Hz). The light meter was held at a distance of 5 mm from the center of the HLEC in all tests. FIG. 13 shows the illuminance behavior, which increases by a factor of ~20 under a voltage change from 2.5-5 kV.

Example 2

A method to fabricate multicolor electroluminescent layers for stretchable display and sensory feedback purposes is disclosed. ZnS phosphor-doped photopolymer was utilized to form red, green, and blue pixels by UV exposure curing, which were then picked up respectively by acrylic stamp supported thermal release tapes and transfer printed onto one single elastomer substrate.

The field of stretchable displays that combines rubbery elasticity with optoelectronic properties has attracted many attentions and attempts via different approaches in recent years.

In another embodiment, transparent hydrogel electrodes and ZnS-elastomer composite were used, but switched to a more stretchy silicone elastomer, Ecoflex 30. The surface treatment along with the geometric design enabled a steady light emission up to ~500% linear strain. It could be further integrated onto a soft robot for optical signaling and tactile sensing.

Thus far, the community of stretchable displays has focused largely on developing a technology that could serve as a proof-of-concept. The devices reported are mostly single colored square panels that demonstrate some level of elasticity, but still maintain a certain distance towards a stretchable screen that could be easily expanded and conformed around an arbitrary geometry. The embodiment disclosed herein seeks to 1) increase the number of pixels per unit area; and 2) pattern individual red-green-blue (RGB) units onto the pixelated display panel. Two components of the embodiment, photolithography and transfer printing, will work to address these issues by producing high yield, efficient operations to integrate RGB pixels onto one stretchable elastomeric layer, and distributing arrays of RGB pixels into dense configurations. This embodiment will redefine the structure and functionality of stretchable display and indicate new routes towards commercialization.

Instead of transferring a geometric pattern from a photomask to photoresist then the target material underneath, these light-sensitive photopolymers were directly patterned. These photopolymers, doped with ZnS electroluminescent phosphors, can be cured into arrays of square pixels from viscous liquid state into a stretchy solid state under UV light source within minutes.

The next step is to pick up these pixels from the original rigid plastic substrate and relocate them onto a stretchable polymeric substrate. Traditional developing (dissolving and washing away unexposed regions with a solvent) in photolithography was not used. Another approach, namely transfer printing, was used.

Effective transfer printing relies on the control of adhesion and fracture mechanics at the interfaces between the stamp/ink, ink/donor substrate, and the ink/receiver substrate. At first consideration, a strong adhesion between stamp and ink was needed to pick up these pre-fabricated platelets. Peeling the stamp away leads to removal of this selected structure from the donor substrate. Later when printing onto a receiver substrate, it may be desired that the adhesion between ink and stamp vanish or at least be lower than that between the ink and the receiving substrate.

Transparent acrylic sheets were laser-cut and assembled to make stamps. Then a piece of thermal release tape was placed on each pick-up tip of the stamp. These doubled-sided tapes provide strong adhesion at room temperature and completely lose their viscosity above 90° C. This property enabled us to retrieve ink structures from donor substrate at first and deliver them perfectly onto the receiver substrate afterwards.

Figure 14:
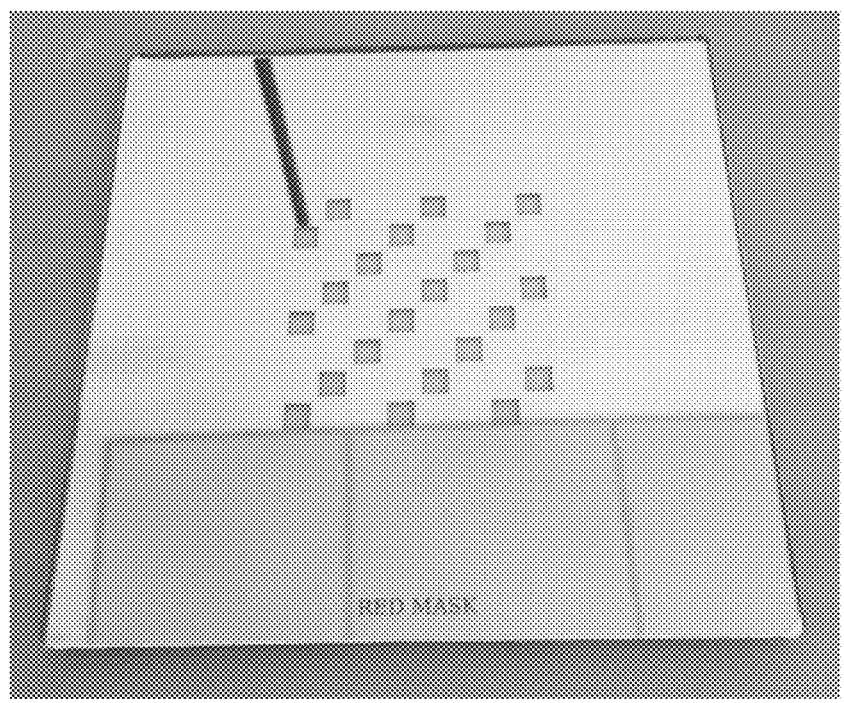
FIG. 14. Quartz photomask for patterning red pixels.
Figure 15:
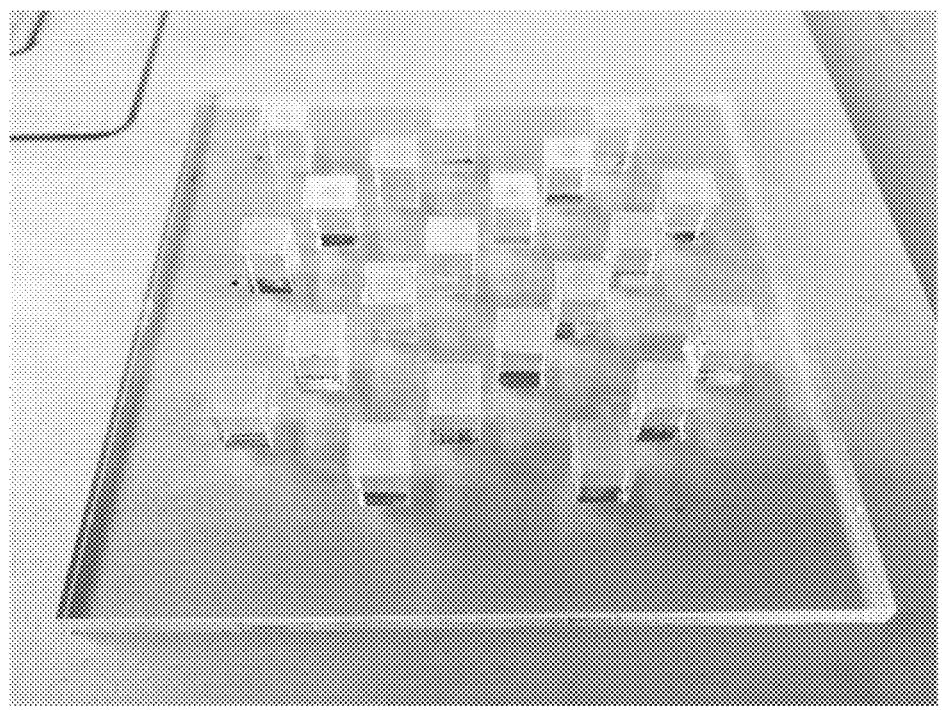
FIG. 15. Pick-up stamp made of acrylic with thermal release tapes attached.
Figure 16:
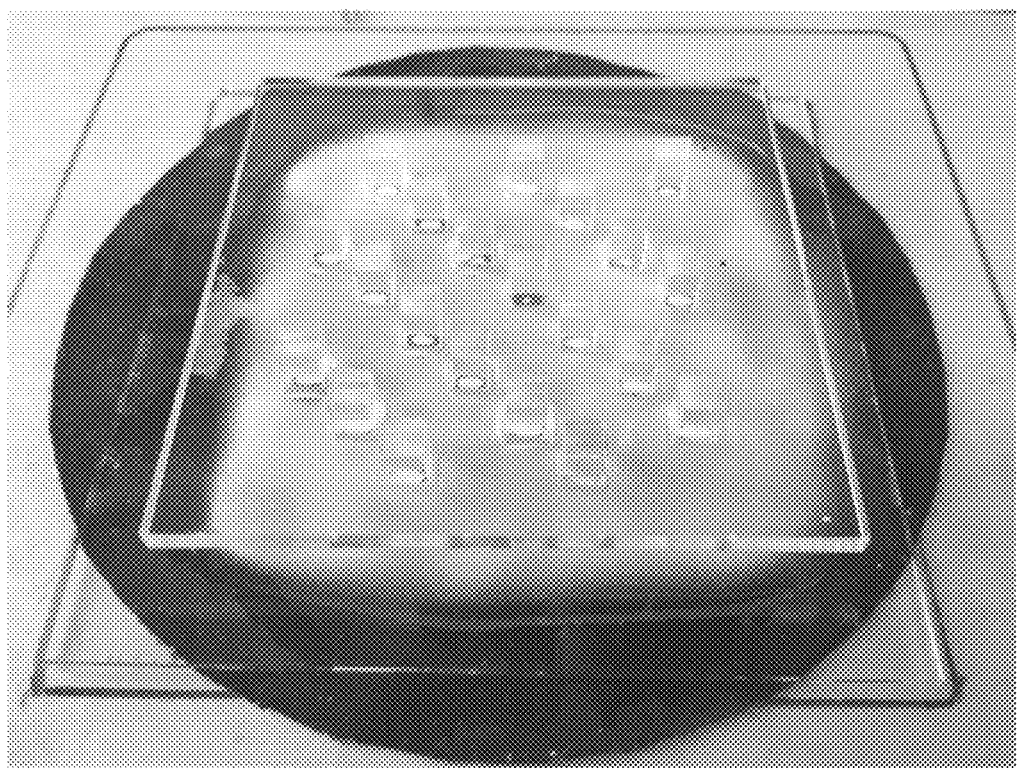
FIG. 16. Stamp (inverted) contacts pre-patterned photopolymer/ZnS composite.
Figure 17:
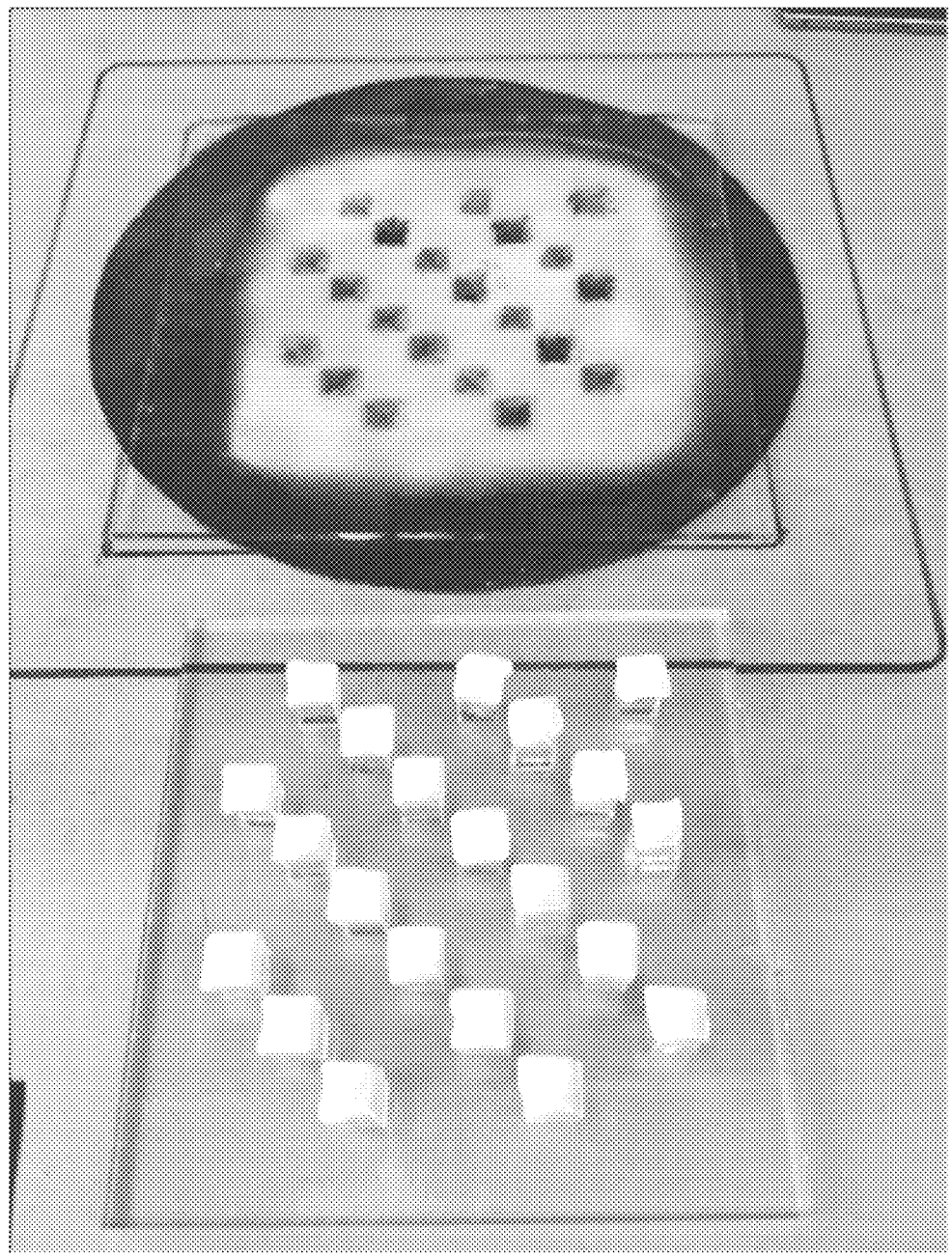
FIG. 17. Stamp selectively retrieves ink platelets from donor substrate.
Figure 18:
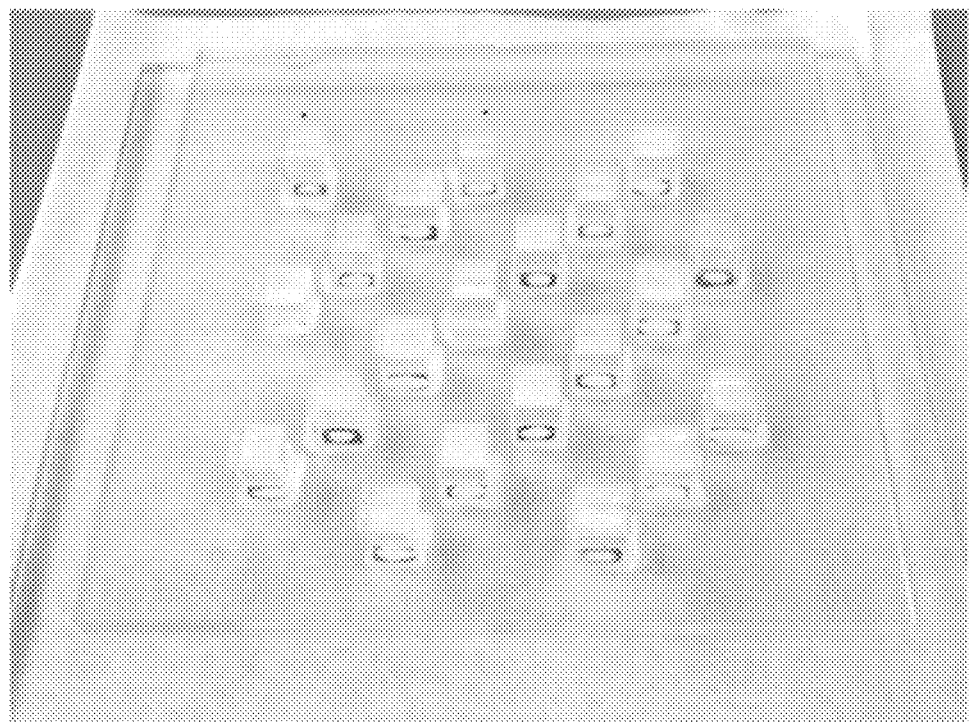
FIG. 18. Stamp (inverted) contacts receiver substrate (Pre-coated Ecoflex silicone).
Figure 19:
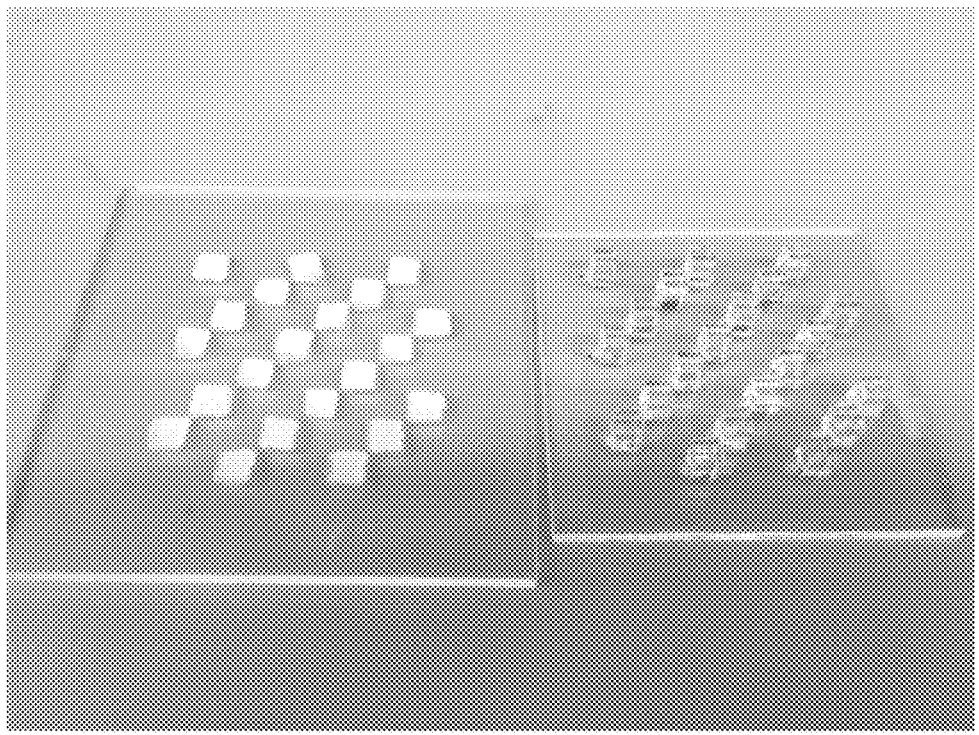
FIG. 19. After baking on hot plate for a while, stamp is released from the receiver substrate, leaving all ink platelets bonded with Ecoflex on the substrate.
Figure 20:
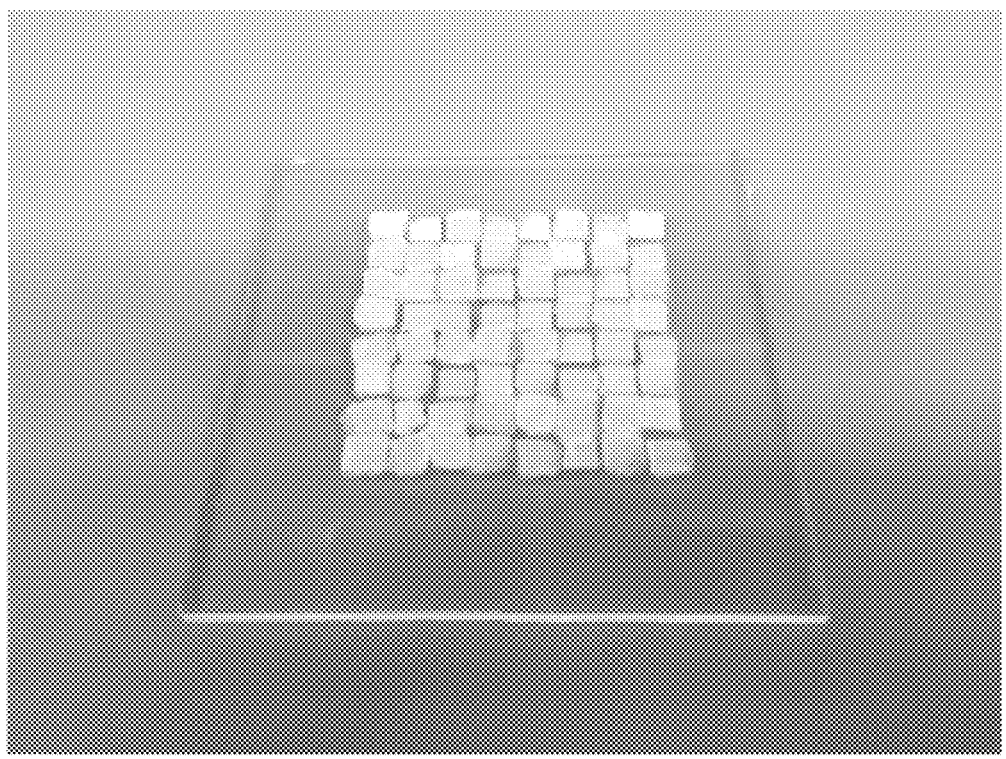
FIG. 20. Repeating the process three times, all three colors are transferred in one sheet.

See FIGS. 14-20 for additional views of an embodiment. FIG. 14 shows a quartz photomask for patterning red pixels. FIG. 15 shows a pick-up stamp made of acrylic with thermal release tapes attached. An inverted stamp contacts the pre-patterned photopolymer/ZnS composite in FIG. 16. The stamp selectively retrieves ink platelets from a donor substrate in FIG. 17. The inverted stamp contacts a receiver substrate in FIG. 18, such as a one made of pre-coated Ecoflex silicone. After baking on a hot plate, the stamp is released from the receiver substrate in FIG. 19, which leaves all ink platelets bonded with Ecoflex on the substrate. The process can be repeated three times in FIG. 20, such that all three colors are transferred in one sheet. Other numbers of repetitions can be performed.

Another advantage of this procedure is that it does not involve any chemical etching or washing, which protects the soft ink platelets and supporting substrate and, therefore, allows multiple transferring and printing cycles in dense layouts over large areas.

Materials mainly composed of silicone elastomers were used due to their unique properties, including high stretchability, compatibility with ZnS phosphors, mutual bonding capability, and low cost. The introduction of thermal release tape helps remove uncontrollable surface chemical treatments and improved the overall yield of good samples. A stamp made of acrylic also was built due to its relatively high surface energy for supporting thermal release tapes and its high transparency for accurate aligning during transfer printing.

The procedure described above is categorized as deterministic assembly, one of the three basis modes for transfer printing. By tuning the ink, material and structure of the stamp, donor substrate, and receiver substrate, it is possible to easily switch to the other two modes, additive transfer and subtractive transfer, for more rapid delivery and smaller features. For instance, the ink for this method is not limited to photopolymer/ZnS composite. It can be light-emitting diodes, quantum dots and other lightweight, flexible/stretchable, active soft materials. The electrodes in the display can also be patterned using the same method. The materials include but not limited to silver nanowires, graphene, and carbon nanotubes. The stamp can be made by multiple materials depending on the geometry of substrates. For planar substrate, transparent hard and rigid materials such as glass or epoxy are recommended due to their high surface energies. For curvilinear substrates, soft materials such as PDMS or polyurethane can provide enough compliance for lamination.

Photolithography and transfer printing have been used for patterning and assembly of micro- and nanomaterials into organized, functionalized layouts. This combination provides a high performance throughput with scalability and cost advantage. The embodiments disclosed herein introduce a new material system for rapid patterning, transferring, and receiving. It can be used for manufacturing stretchable displays based on electroluminescence, quantum dot, and organic/inorganic LEDs. For its good scalability and repeatability, by switching the ink to other soft matters, it can be further extended to fabricate organic transistors, sensors, and actuators.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A device comprising one or more light-emitting capacitors comprising:
   a first electrode;
   a second electrode;
   an electroluminescent layer comprising an elastomeric material doped with semiconducting nanoparticles, wherein the electroluminescent layer is disposed between the first electrode and the second electrode; and
   at least one elastomeric material layer that encapsulates the first electrode, the second electrode, and the electroluminescent layer;
   wherein the one or more of the light-emitting capacitors is/are configured to provide dynamic coloration, exteroception, proprioception, or a combination thereof in the device.

2. The device of claim 1, wherein the elastomeric material of the electroluminescent layer includes a transparent or translucent silicone, polyurethane, fluoroelastomer, or a combination thereof.

3. The device of claim 1, wherein the elastomeric material of the elastomeric material layer includes silicone.

4. The device of claim 1, wherein the elastomeric material layer has an elastic modulus from 1 kPa to 10 MPa.

5. The device of claim 1, wherein the semiconducting nanoparticles are ZnS nanoparticles, ZnSe nanoparticles, CdSe nanoparticles, CdS nanoparticles, ZnO nanoparticles, CdO nanoparticles, $Cu_2S$ nanoparticles, $CuInSe_2$ nanoparticles, CdZnO nanoparticles, CdTe nanoparticles, or a combination thereof.

6. The device of claim 1, wherein the semiconducting nanoparticles comprise a dopant.

7. The device of claim 6, wherein the dopant is selected from copper ions, manganese ions, zinc ions, indium ions, chloride ions, aluminum ions, or a combination thereof.

8. The device of claim 6, wherein the dopant is present at from 0.1 to 5% by mass.

9. The device of claim 1, wherein the light-emitting capacitor is configured to reversibly stretch uniaxially to at least 300% strain while emitting light having a wavelength from 400 nm to 700 nm.

10. The device of claim 1, wherein the light-emitting capacitor is configured to reversibly stretch uniaxially to at least 500% strain while emitting light having a wavelength from 400 nm to 700 nm.

11. The device of claim 1, wherein the light-emitting capacitor is configured to reversibly expand its surface area by at least 300% while emitting light having a wavelength from 400 nm to 700 nm.

12. The device of claim 1, wherein the light-emitting capacitor is configured to reversibly expand its surface area by at least 500% while emitting light having a wavelength from 400 nm to 700 nm.

13. The device of claim 1, wherein at least two of the elastomeric material layers encapsulate the first electrode, the second electrode, and the electroluminescent layer.

14. The device of claim 1, wherein the first electrode is a first hydrogel electrode and the second electrode is a second hydrogel electrode.

15. The device of claim 14, wherein the first hydrogel electrode and the second hydrogel electrode include polyacrylamide, poly(hydroxyethyl methacrylate), poly(ethylene glycol) diacrylate, a triacrylate, or a combination thereof and/or an aqueous salt.

16. The device of claim 15, wherein the first hydrogel electrode and the second hydrogel electrode include the aqueous salt, and wherein the aqueous salt includes lithium chloride.

17. The device of claim 15, wherein the first hydrogel electrode and the second hydrogel electrode include the aqueous salt, and wherein the aqueous salt is present at from 0.1 to 50% by volume.

18. The device of claim 1, wherein the first electrode is a first conductive electrode and the second electrode is a second conductive electrode.

19. The device of claim 18, wherein one or both of the first and second conductive electrodes comprise a film of carbon black, single-walled carbon nanotubes (SWCNTs), multi-walled carbon nanotubes (MWCNTs), poly(3,4-ethylenedioxythiophene) polystyrene sulfonate (PEDOT:PSS), or polyaniline.

20. The device of claim 18, wherein the elastomeric material layer includes silicone having an elastic modulus of 1 kPa to 10 MPa.

21. The device of claim 18, wherein a total thickness of the light-emitting capacitor is from 10 microns to 1 cm.

22. The device of claim 18, wherein the semiconducting nanoparticles comprises a dopant.

23. The light-emitting capacitor of claim 22, wherein the semiconductor nanoparticles are ZnS and the dopant is Cu, wherein the semiconductor nanoparticles are ZnS and the dopants are Cu and Cl, wherein the semiconductor nanoparticles are ZnS and the dopants are Cu and Al, and/or wherein the semiconductor nanoparticles are ZnS and the dopants are Cu, Mn, and Al.

24. The device of claim 18, wherein the light-emitting capacitor is configured to stretch uniaxially to at least 150% strain while emitting light having a wavelength from 400 nm to 700 nm.

25. The device of claim 1, wherein the device is a robot, a display, or a human touch interface and wherein the one or more of the light-emitting capacitors is/are disposed on a portion of or all of an exterior surface of the device.

26. A fabrication method of the device of claim 1, wherein the fabrication includes using one or more of replica molding, spray patterning, inkjet printing, spin-coating, tape casting, or screen-printing.

27. The fabrication method of claim 26, wherein the fabrication includes one or more of spray patterning, inkjet printing, spin-coating, tape casting, or screen-printing, wherein a sprayable electrode precursor comprises a dispersion with a solvent.

28. The fabrication method of claim 27, wherein the solvent is at least one of an aqueous solvent for PEDOT:PSS, polyaniline, and COOH-functionalized multi- and single-walled carbon nanotubes or the solvent is an organic-based solvent.

29. The fabrication method of claim 28, wherein the organic-based solvent is one or more of toluene or dimethyl sulfoxide for non-functionalized multi- and single-walled carbon nanotubes.

30. A material comprising a plurality of light-emitting capacitors, each of the light-emitting capacitors comprising:
   a first electrode;
   a second electrode;
   an electroluminescent layer comprising an elastomeric material doped with semiconducting nanoparticles, wherein the electroluminescent layer is disposed between the first electrode and the second electrode; and
   at least one elastomeric material layer that encapsulates the first electrode, the second electrode, and the electroluminescent layer;
   wherein the plurality of light-emitting capacitors are disposed in the at least one elastomeric material layer; and
   wherein the material comprising the plurality of light-emitting capacitors is disposed on at least a portion of an elastomeric foam material.

31. The material of claim 30, wherein two of the elastomeric material layers encapsulate the plurality of light emitting capacitors.

32. The material of claim 30, wherein the plurality of light emitting capacitors include a ZnS-based material ranging in size from 10 nm to 10 micron diameters.

33. The material of claim 30, wherein the plurality of light emitting capacitors comprise ZnS nanoparticles doped with Cu that range in size from 10 nm to 10 micron diameters.

34. The material of claim 30, wherein the material and/or light emitting capacitors is/are configured to provide sensory feedback.

35. The material of claim 30, wherein the material is disposed on at least a portion of a robot, a fluidically actuated device, or a human-touch device.

36. The material of claim 30, wherein the material is disposed on at least a portion of a display.

37. A device comprising:
   one or more light-emitting capacitors comprising:
      a first electrode;
      a second electrode;
      an electroluminescent layer comprising an elastomeric material doped with semiconducting nanoparticles, wherein the electroluminescent layer is disposed between the first electrode and the second electrode; and
      at least one elastomeric material layer that encapsulates the first electrode, the second electrode, and the electroluminescent layer; and
   a pneumatic or hydraulic actuator comprising:
      an inextensible layer encased in a second elastomeric material; and
      a second elastomeric material layer including at least one independently-controlled chamber,
   wherein the at least one elastomeric material of the one or more light-emitting capacitors is disposed on the second elastomeric material layer of the pneumatic or hydraulic actuator.

38. The device of claim 37, wherein the inextensible layer includes an inextensible woven or unwoven fiber mesh and the second elastomeric material encasing the inextensible layer includes silicone, fluoropolymer, or polyurethane.

39. The device of claim 37, wherein the inextensible layer includes a nylon.

40. The device of claim 37, wherein the second elastomeric material layer includes silicone, fluoroelastomer, or polyurethane.

* * * * *